US011765971B2

(12) United States Patent
Yam et al.

(10) Patent No.: US 11,765,971 B2
(45) Date of Patent: *Sep. 19, 2023

(54) LUMINESCENT TETRADENTATE GOLD(III) COMPOUNDS FOR ORGANIC LIGHT-EMITTING DEVICES AND THEIR PREPARATION

(71) Applicant: THE UNIVERSITY OF HONG KONG, Hong Kong (CN)

(72) Inventors: Vivian Wing-Wah Yam, Hong Kong (CN); Hok-Lai Wong, Hong Kong (CN); Yiu-Wing Wong, Hong Kong (CN); Mei-Yee Chan, Hong Kong (CN)

(73) Assignee: The University of Hong Kong, Hong Kong (CN)

( * ) Notice: Subject to any disclaimer, the term of this patent is extended or adjusted under 35 U.S.C. 154(b) by 70 days.

This patent is subject to a terminal disclaimer.

(21) Appl. No.: 17/237,674

(22) Filed: Apr. 22, 2021

(65) Prior Publication Data

US 2021/0249612 A1 Aug. 12, 2021

Related U.S. Application Data

(63) Continuation of application No. 15/419,501, filed on Jan. 30, 2017, now Pat. No. 11,018,310.

(60) Provisional application No. 62/288,514, filed on Jan. 29, 2016.

(51) Int. Cl.
| | |
|---|---|
| *H01L 51/54* | (2006.01) |
| *H10K 85/30* | (2023.01) |
| *C07F 1/12* | (2006.01) |
| *H10K 71/12* | (2023.01) |
| *C07F 1/00* | (2006.01) |
| *C09K 11/06* | (2006.01) |
| *H10K 50/11* | (2023.01) |
| *H10K 71/13* | (2023.01) |
| *H10K 71/16* | (2023.01) |
| *H10K 101/10* | (2023.01) |

(52) U.S. Cl.
CPC ............ *H10K 85/371* (2023.02); *C07F 1/00* (2013.01); *C07F 1/12* (2013.01); *C09K 11/06* (2013.01); *H10K 71/12* (2023.02); *C09K 2211/1007* (2013.01); *C09K 2211/1011* (2013.01); *C09K 2211/1014* (2013.01); *C09K 2211/1029* (2013.01); *C09K 2211/1092* (2013.01); *C09K 2211/188* (2013.01); *H10K 50/11* (2023.02); *H10K 71/135* (2023.02); *H10K 71/164* (2023.02); *H10K 2101/10* (2023.02)

(58) Field of Classification Search
None
See application file for complete search history.

(56) References Cited

U.S. PATENT DOCUMENTS

| 11,018,310 B2 * | 5/2021 | Yam .......................... C07F 1/00 |
| 2005/0186443 A1 | 8/2005 | Marrocco, III et al. |
| 2014/0084261 A1 | 3/2014 | Brooks et al. |

FOREIGN PATENT DOCUMENTS

JP 2007-053132 A 3/2007

OTHER PUBLICATIONS

Yam, V. W. et al., Luminescent Gold(III) Alkynyl Complexes: Synthesis, Structural Characterization, and Luminescence Properties, Angewandte Chemie International Edition, 2005, 44(20):3107-3110, Wiley-VCH Verlag GmbH & Co. KGaA, Weinheim.
Tang, M. et al., Dendritic Luminescent Gold(III) Complexes for Highly Efficient Solution-Processable Organic Light-Emitting Devices, Angewandte Chemie International Edition, 2013, 52(1):446-449, Wiley-VCH Verlag GmbH & Co. KGaA, Weinheim.
Kumar, R. et al., Luminescent (NCC) Gold(III) Complexes: Stabilized Gold(III) Fluorides, Angewandte Chemie International Edition, 2015, 54(48):14287-14290, Wiley-VCH Verlag GmbH & Co. KGaA, Weinheim.
Tang, C.W. et al., Organic electroluminescent diodes, Applied Physics Letters, Sep. 21, 1987, 51(12):913-915, American Institute of Physics.
Braun, D. et al., Visible light emission from semiconducting polymer diodes, Applied Physics Letters, May 6, 1991, 58(18):1982-1984, American Institute of Physics.
O'Brien, D. F. et al., Improved energy transfer in electrophosphorescent devices, Applied Physics Letters, Jan. 18, 1999, 74(3):442-444, American Institute of Physics.
Baldo, M.A. et al., Very high-efficiency green organic light-emitting devices based on electrophosphorescence, Applied Physics Letters, Jul. 5, 1999, 75(1):4-6, American Institute of Physics.
Adachi, C. et al., Endothermic energy transfer: A mechanism for generating very efficient high-energy phosphorescent emission in organic materials, Applied Physics Letters, Sep. 24, 2001, 79(13):2082-2084, American Institute of Physics.
Kawamura, Y. et al., 100% phosphorescence quantum efficiency of Ir(III) complexes in organic semiconductor films, Applied Physics Letters, 2005, 86(7):071104-1 to 071104-3, American Institute of Physics.

(Continued)

Primary Examiner — Andrew K Bohaty
(74) Attorney, Agent, or Firm — Saliwanchik, Lloyd & Eisenschenk

(57) ABSTRACT

A highly rigid tetradentate ligand is combined with a gold (III) ion as a thermally stable tetradentate gold(III) complex. The tetradentate gold(III) complex is a tetradentate gold(III) compound that can be used as a light-emitting material which can be used for fabricated of light-emitting devices such as an organic light-emitting diode (OLED). The tetradentate gold(III) compound can be deposited as a layer or a component of a layer using a solution-process or a vacuum deposition process. The luminescent tetradentate gold(III) compounds are robust and can provide electroluminescence (EL) with a high efficiency and brightness.

20 Claims, 15 Drawing Sheets

(56) References Cited

OTHER PUBLICATIONS

Wong, K. M. et al., A novel class of phosphorescent gold(III) alkynyl-based organic light-emitting devices with tunable colour, Chemical Communications, 2005, (23):2906-2908, The Royal Society of Chemistry.
Roşca, D. et al., Cyclometallated gold(III) hydroxides as versatile synthons for Au—N, Au—C complexes and luminescent compounds, Chemical Communications, May 23, 2012, 48(58):7247-7249, The Royal Society of Chemistry.
Kui, S. C. F. et al., Robust phosphorescent platinum(II) complexes with tetradentate ONNCN ligands: high efficiency OLEDs with excellent efficiency stability, Chemical Communications, Jan. 16, 2013, 49(151:1497-1499, The Royal Society of Chemistry.
Au, V. K. et al., Luminescent Cyclometalated Dialkynylgold(III) Complexes of 2-Phenylpyridine-Type Derivatives with Readily Tunable Emission Properties, Chemistry: A European Journal, 2011, 17(1):130-142, Wiley-VCH Verlag GmbH & Co. KGaA, Weinheim.
Maity, A. et al., Suzuki-Miyaura coupling of arylboronic acids to gold(III), Chemical Science, Nov. 6, 2014, 6(2):981-986, The Royal Society of Chemistry, DOI: 10.1039/c4sc02148g.
Burrows, P. E. et al., Prospects and applications for organic light-emitting devices, Current Opinion in Solid State and Materials Science, 1997, 2(2):236-243, Current Chemistry Ltd.
David, B. et al., Gold(III) compounds containing a chelating, dicarbanionic ligand derived from 4,4'-di-tert-butylbiphenyl, Dalton Transactions, May 27, 2014, 43:11059-11066, The Royal Society of Chemistry.
Rausch, A. F. et al., Matrix Effects on the Triplet State of the OLED Emitter Ir(4,6-dFppy)$_2$(pic) (FIrpic): Investigations by High-Resolution Optical Spectroscopy, Inorganic Chemistry, Jan. 27, 2009, 48(5):1928-1937, American Chemical Society.
Wong, K. M. et al., A Class of Luminescent Cyclometalated Alkynylgold(III) Complexes: Synthesis, Characterization, and Electrochemical, Photophysical, and Computational Studies of [Au(CCNC)(C≡C-R)] (CNC = $\kappa^3$C,N,C Bis-cyclometalated 2,6-Diphenylpyridyl), Journal of the American Chemical Society, Mar. 16, 2007, 129(14):4350-4365, American Chemical Society, Washington, D.C.
Au, V. K. et al., High-Efficiency Green Organic Light-Emitting Devices Utilizing Phosphorescent Bis-cyclometalated Alkynylgold(III) Complexes, Journal of the American Chemical Society, Sep. 17, 2010, 132(40):14273-14278, American Chemical Society.
Tang, M. et al., Bipolar Gold(III) Complexes for Solution-Processable Organic Light Emitting Devices with a Small Efficiency Roll-Off, Journal of the American Chemical Society, Dec. 11, 2014, 136(51):17861-17868, American Chemical Society.
Yam, V. W. et al., Syntheses, Crystal Structures and Photophysics of Organogold(III) Diimine Complexes, Journal of the Chemical Society, Dalton Transactions, 1993, (6):1001-1002, Royal Society of Chemistry.
Kaneto, K. et al., Electroluminescence in Polyethylene Terephthalate, Japanese Journal of Applied Physics, 1974, 13(6):1023-1024, Japan Society of Applied Physics.
Hamada, Y. et al., Blue Electroluminescence in Thin Films of Azomethin-Zinc Complexes, Japanese Journal of Applied Physics, Apr. 1, 1993, 32(Pt. 2)(4A):L511-L513, Japan Society of Applied Physics.
Burroughes, J.H. et al., Light-emitting diodes based on conjugated polymers, Nature, Oct. 11, 1990, 347:539-541, Nature Publishing Group.
Baldo, M.A. et al., Highly efficient phosphorescent emission from organic electroluminescent devices, Nature, Sep. 10, 1998, 395:151-154, Macmillan Publishers Ltd.
Welter, S. et al., Electroluminescent device with reversible switching between red and green emission, Nature, Jan. 2, 2003, 421:54-57, Nature Publishing Group.
Adamovich, V. et al., High efficiency single dopant white electrophosphorescent light emitting diodes, New Journal of Chemistry, 2002, 26(9):1171-1178, The Royal Society of Chemistry and the Centre National de la Recherche Scientifique.
Wong, K. et al., Application of 2,6-Diphenylpyridine as a Tridentate [CCNC] Dianionic Ligand in Organogold(III) Chemistry. Structural and Spectroscopic Properties of Mono- and Binuclear Transmetalated Gold(III) Complexes, Organometallics, Jul. 10, 1998, 17(16):3505-3511, American Chemical Society.
Helfrich, W. et al., Recombination Radiation in Anthracene Crystals, Physical Review Letters, Feb. 15, 1965, 14(71:229-231, American Physical Society.
Baldo, M. A. et al., Phosphorescent materials for application to organic light emitting devices, Pure and Applied Chemistry, 1999, 71(11):2095-2106, International Union of Pure and Applied Chemistry (IUPAC).
Kröhnke, F., The Specific Synthesis of Pyridines and Oligopyridines, Jan. 1976, (1):1-24.
Office Action dated Mar. 18, 2019 in U.S. Appl. No. 15/419,501.
Office Action dated Sep. 11, 2019 in U.S. Appl. No. 15/419,501.
Office Action dated Jan. 23, 2020 in U.S. Appl. No. 15/419,501.
Office Action dated Aug. 31, 2020 in U.S. Appl. No. 15/419,501.
Notice of Allowance dated Jan. 25, 2021 in U.S. Appl. No. 15/419,501.

* cited by examiner

LUMINESCENT TETRADENTATE GOLD(III) COMPOUNDS FOR ORGANIC LIGHT-EMITTING DEVICES AND THEIR PREPARATION

CROSS-REFERENCE TO A RELATED APPLICATIONS

This application is a continuation of U.S. patent application Ser. No. 15/419,501, filed Jan. 30, 2017, which claims the benefit of U.S. Provisional Application Ser. No. 62/288,514, filed Jan. 29, 2016, the disclosure of which is hereby incorporated by reference in its entirety, including all figures, tables and drawings.

TECHNICAL FIELD

Cyclometalated tetradentate gold(III) compounds, their synthesis, and their use as light-emitting material in phosphorescence-based organic light-emitting devices (OLEDs) are described.

BACKGROUND OF INVENTION

In recent years, extensive attention has been drawn towards the research and development of OLEDs. The enormous size and scope of research is related to potential applications of OLEDs in commercial flat panel displays and solid-state lighting systems. Because of their low cost, light weight, low operating voltage, high brightness, robustness, wide color tunability, wide viewing angle, ease of fabrication onto flexible substrates and low energy consumption, OLEDs are remarkably attractive candidates for flat panel display technologies.

Typically, an OLED contains several layers of semiconductor materials sandwiched between two conducting electrodes. The cathode is composed of a low work function metal alloy deposited by vacuum evaporation, whereas the anode is a transparent conductor such as indium tin oxide (ITO). Upon application of a DC voltage, holes injected by the ITO electrode and electrons injected by the metal electrode recombine to form excitons. Subsequent relaxation of excitons results in the generation of electroluminescence (EL).

To achieve higher OLED performance, multiple layers of functional materials can be incorporated that further separate the two electrodes. There are two main categories of materials that are used as these functional layers, namely vacuum-deposited small molecules and spin-coated polymeric materials. Both fabrication methods have their respective advantages. Vacuum deposition generally allows better control over layer thickness and uniformity while spin coating generally offers a less complex fabrication process having lower production cost [Burrows, P. E.; Forrest, S. R.; Thompson, M. E. *Curr. Opin. Solid State Mater. Sci.* 2, 236 (1997)].

In spite of the fact that EL from organic polymers was initially reported in the 1970s [Kaneto, K.; Yoshino, K.; Koa, K.; Inuishi, Y *Jpn. J Appl. Phys.* 18, 1023 (1974)], it was only after a report on yellow-green EL from poly(p-phenylenenvinylene) (PPV) that light-emitting polymers and OLEDs received much attention [Burroughs, J. H.; Bradley, D. D. C.; Brown, A. R.; Marks, N; Friend, R. H.; Burn, P. L.; Holmes, A. B. *Nature* 347, 539 (1990)]. Subsequently, similar studies reported PPV derivatives as light-emitting polymers [Braun, D.; Heeger, A. J. *Appl. Phys. Lett.* 58, 1982 (1991)]. Since then, many new electroluminescent polymers have been investigated with improved photophysical properties.

EL from organic materials was first discovered in anthracene crystals immersed in liquid electrolyte in 1965 [Helfruch, W.; Schneider, W. G. *Phys. Rev. Lett.* 14, 229 (1965)]. Although lower operating voltages were achieved by using a thin film of anthracene with solid electrodes, very low efficiencies were encountered with these single-layer devices. High-performance green EL from an organic small molecule, tris-(8-hydroxyquinoline)aluminum ($Alq_3$), was first reported in 1987 [Tang, C. W.; Van Slyke, S. A. *Appl. Phys. Lett.* 51, 913 (1987)]. A double-layer OLED with high efficiency and low operating voltage was described where $Alq_3$ was utilized as an emitting layer and as an electron transporting layer with diamine as hole transporting layer. Subsequent modification of the device architecture to produce a triple-layer structure gave better performance with higher efficiency.

Superior performance of phosphorescence-based OLEDs can be realized when the emissive materials have short radiative lifetimes. Short radiative lifetimes can be achieved by mixing singlet and triplet excited states and exploiting spin-orbit (L-S) coupling. In the presence of a heavy metal center, the propensity of spin-orbit coupling can be greatly enhanced. Hence, the use of heavy metal complexes in OLEDs is generally advantageous relative to the use of pure organic materials. The lowest energy excited state of an organometallic compound with it-acceptor ligand is commonly a metal-to-ligand charge transfer (MLCT) triplet state, which can mix with the excited singlet state through L-S coupling, resulting in higher photoluminescence efficiencies [Baldo, M. A.; Thompson, M. E.; Forrest, S. R. *Pure Appl. Chem.* 71, 2095 (1999)]. In 1998, Baldo et al. demonstrated a phosphorescent EL device with high internal quantum efficiency by using platinum(II) 2,3,7,8,12,13,17,18-octaethyl-21H,23H-porphyrin (PtOEP) as a dopant [Baldo, M. A.; O'Brien, D. F.; You, Y; Shoustikow, A.; Sibley, S.; Thompson, M. E.; Forrest, S. R. *Nature* 395, 151 (1998); O'Brien, D. F.; Baldo, M. A.; Thompson, M. E.; Forrest, S. R. *Appl. Phys. Lett.* 74, 442 (1999)]. A multilayer device consisting of an emitting layer of $Alq_3$ doped with PtOEP showed a strong emission at 650 nm attributed to the triplet excitons of PtOEP.

Cyclometalated iridium(III) compounds show intense phosphorescence and are another class of materials widely used in the fabrication of high efficiency OLEDs. The use of fac-tri(2-phenylpyridine)iridium(III) [$Ir(ppy)_3$] as phosphorescent emitting dopant in a 4,4'-N,N'-diarbazole-biphenyl (CBP) host yields high efficiency OLEDs [Baldo, M. A.; Lamansky, S.; Burrows, P. E.; Thompson. M. E.; Forrest, S. R. *Appl. Phys. Lett.* 75, 4 (1999)]. In light of the rich photoluminescence properties of [$Ir(ppy)_3$], there has been a growing interest in the incorporation of 2-phenylpyridine derivatives into iridium(III) center to prepare triplet emitters for OLED applications. Another triplet emitter is the sky-blue light-emitting complex, iridium(III) bis[2-(4',6'-difluorophenyl)pyridinato-N,$C^2$]-picolinate [$Ir(4,6-dFppy)_2(pic)$], which exhibits a very high photoluminescence quantum yield of about 60% in solution and nearly 100% in a solid film when doped into high triplet energy host [Rausch, A. F.; Thompson, M. E.; Yersin, H. *Inorg. Chem.* 48, 1928 (2009); Adachi, C; Kwong, R. C.; Djurovich, P. I.; Adamovich, V; Baldo, M. A.; Thompson, M. E.; Forrest, S. R. *Appl. Phys. Lett.* 79, 2082 (2001); Kawamura, Y.; Goushi K.; Brooks, J.; Brown, J. J.; Sasabe, H.; Adachi, C. *Appl. Phys. Lett.* 86, 071104 (2005)]. In spite of the extensive use of 2-phenylpyridine and its derivatives in iridium(III) systems for the fabrication of OLEDs, the use of phosphors containing alternative metal centers with these ligands remains under-explored and under-developed.

In addition to enhancing the external quantum efficiencies (EQE), the ability to vary the emission color is desirable. Most approaches to color variance involve use of multi-component blended mixtures of light-emitting materials with different emission characteristics or different light-emitting materials for color tuning. Examples of a single light-emitting material as dopant to generate more than one emission color are rare. Recent studies have shown that different emission colors from a single emissive dopant can be generated by using a phosphorescent material, by changing the bias direction or by changing the dopant concentration. An OLED can be fabricated from a semiconducting polymer PPV and phosphorescent ruthenium polypyridine dopant [Welter, S.: Krunner, K.; Hofstraat, J. W.; De Cola, L. Nature 421, 54 (2003)]. Under a forward bias, red emission from the excited state of the phosphorescent ruthenium polypyridine dopant was observed while the OLED emitted a green emission under reverse bias where the lowest excited singlet state of PPV was populated. A series of phosphorescent platinum(II) [2-(4,6-difluorophenyl) pyridinato-N,C]-β-diketones as single emissive dopants has been demonstrated in OLEDs [Adamovieh, V; Brooks, J.; Tamayo, A.; Alexander, A. M.; Djurovich. P. R.; D'Andrade, B. W.; Adachi, C.; Forrest, S. R.; Thompson, M. E. New J. Chem. 26, 1171 (2002)]. Both blue emission from monomeric species and orange emission from the aggregates were observed in such OLED where the relative intensity of the orange emission increased as the doping level increased. As a result, the EL color can be tuned by changing the dopant concentration with equal intensities of the monomeric and aggregate bands. In both cases, the change of EL color in an OLED can be accomplished by varying the external stimulus or fabrication conditions while employing the same light-emitting material.

Emitting materials that have long EL device operational lifetimes as well as high EL performances are crucial. These properties are closely related to the structure of the metal complexes. It appears that for square-planar metal complexes, their thermal stability and rigidity are of great importance in the device performance as well as the operational lifetime. Greater stability as well as a lowering of non-radiative decay rate can be achieved by employing rigid tetradentate ligands to confine the metal center. The first tetradentate metal complex used as emitting material was a zinc(II) Schiff base complex, in which a blue-emitting OLED was fabricated by vacuum vapor deposition [Hamada, Y.; Takeshi, S.; Fujita, M.; Fujii, T.; Nishio, Y; Shibata, K. Jpn. J Appl. Phys. 32, L511 (1993)]. However, device performance based on this emitter was found to be poor due to the lack of triplet exciton harvesting. Later, a porphyrin-based platinum(II) triplet emitter, PtOEP, was employed [Baldo, M. A.; O'Brien, D. F.; You, Y; Shoustikow, A.; Sibley, S.; Thompson, M. E.; Forrest, S. R. Nature 395, 151 (1998)]. This device showed peak external and internal quantum efficiencies of 4% and 23%, respectively. The low device performance is believed to be limited by low photoluminescence quantum yields of the emitter. Recently, rigid tetradentate O^N^C^N platinum(II) complexes were reported to have a photoluminescence quantum yields of 90% and display good thermal stability. Because if these advantages, phosphorescent OLEDs (PHOLEDs) with high device efficiency and stability have been achieved with EQE of 18.2% and current efficiency of 66.7 cd A$^{-1}$ [Kui, S. C. F.; Chow, P. K.; Cheng, G. C.; Kwok, C.-C.; Kwong, C. L.; Low, K.-H.; Che, C.-M. Chem. Comm. 49, 1497 (2013)].

Even with an increased interest in electrophosphorescent materials, particularly metal complexes with heavy metal centers, most developments have focused on the use of iridium(III), platinum(II) and ruthenium(II) centers, while the use of other metal centers has been much less explored. In contrast to isoelectronic platinum(II) compounds, which are known to exhibit rich luminescence properties, very few examples of luminescent gold(III) complexes have been reported, probably due to the presence of low-energy d-d ligand field (LF) states and the electrophilicity of the gold (III) metal center. One way to enhance the luminescence of gold(III) complexes is through the introduction of strong σ-donating ligands, as was first demonstrated for stable gold(III) aryl and alkyl compounds found to display interesting photoluminescence properties at room temperature [Yam, V. W.-W.; Choi, S. W.-K.; Lai, T.-F.; Lee, W.-K. J. Chem. Soc., Dalton Trans. 1001 (1993)]. Subsequently, a series of bis-cyclometalated alkynylgold(III) compounds with various strong σ-donating alkynyl ligands were found to exhibit rich luminescence behaviors at room temperature and below in various media [Yam, V. W.-W.; Wong, K. M.-C.; Hung, L.-L.; Zhu, N. Angew. Chem. Int. Ed. 44, 3107 (2005); Wong, K, M.-C.; Hung, L,-L.; Lam, W. H.; Zhu, N.; Yam, V. W.-W. J. Am. Chem. Soc. 129, 4350 (2007)]. This class of highly luminescent gold(III) compounds were first employed as dopants for emissive layers of OLEDs, displaying a high brightness and EQE of 10,000 cd m$^{-2}$ and 5.5%, respectively [Wong, K. M.-C.; Zhu, X.; Hung, L.-L.; Zhu, N.; Yam, V. W.-W.; Kwok, H.-S. Chem. Comm. 2906 (2005)]. A class of phosphorescent material of cyclometalated alkynylgold(III) compounds has been fabricated as emissive dopants of OLEDs by vapor deposition where the optimized OLED reached an EQE of 11.5% and a current efficiency of 37.4 cd A$^{-1}$ [Au, K.-M.; Wong, K. M.-C.; Tsang, D. P.-K.; Chan, M. Y.; Yam, V W.-W. J. Am. Chem. Soc. 132, 14273 (2010)]. Hence, alkynylgold(III) complexes are promising phosphorescent materials in terms of efficiency and thermal stability. A series of dendritic luminescent gold(III) complexes with very good solubilities as well as very high luminescence quantum yields have been prepared and employed in the fabrication of high-performance solution-processed devices that display a high EQE of 7.8% and a current efficiency of 24.0 cd A$^{-1}$ [Tang, M.-C.; Tsang, D. P.-K.; Chan, M. M.-Y, Wong, K. M.-C.; Yam, V W.-W. Angew. Chem. Int. Ed. 52, 446 (2013)]. By changing the dendritic alkynyl ligand to a bipolar ligand containing triphenylamine and benzimidazole, gold(III) complexes demonstrate higher photoluminescence quantum yields, of up to 75%, in spin-coated thin films. OLEDs based on these complexes exhibited an EQE of 10.0% and a current efficiency of 33.6 cd A$^{-1}$. More importantly, such OLEDs exhibit an extremely small efficiency roll-off, of less than 1% at brightness of 1,000 cd m$^{-2}$.[Tang, M.-C.; Tsang, D. P.-K.; Chan, M. M.-Y., Wong, K. M.-C.; Yam, V W.-W J. Am. Chem. Soc. 136, 17861 (2014)]. Apart from bidentate and tridentate ligands, gold(III) compounds with tetradentate ligands have not been reported.

BRIEF SUMMARY

Embodiments of the invention are directed to highly rigid tetradentate ligands and their use in the synthesis of thermally stable tetradentate gold(III) complexes and their applications in the fabrication of OLEDs using solution-processing or vacuum deposition techniques. These robust luminescent gold(III) compounds with tetradentate ligands provide EL with high efficiency and brightness when used as light-emitting materials in OLEDs.

The novel class of luminescent tetradentate gold(III) compounds comprise a tetradentate ligand containing four ligating sites coordinated to a gold(III) metal center. The ligation site consists of coordinating atoms that can be, for example, nitrogen, carbon, or σ-donating groups, for example, alkynyl and aryl groups.

The compounds according to an embodiment of the invention, have the chemical structure shown in Formula I:

Formula I

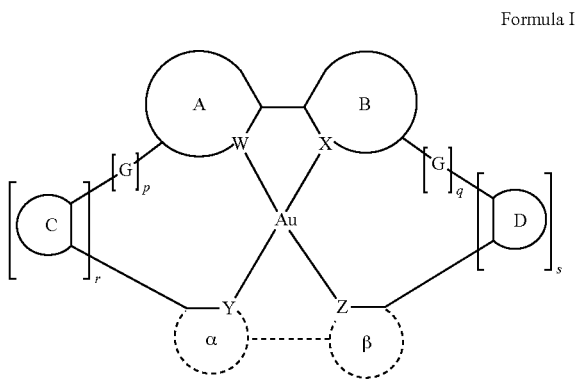

wherein:

(a) W, X, Y and Z are independently selected from C, O, N, P, C—C≡C(alkynyl), C—N≡C(isocyanide) or C—C≡N (cyanide), where the atom that is in bold-faced represents the coordinating site;

(b) A, B, C and D are independently a cyclic derivatives selected from substituted or unsubstituted pyridine group, substituted or unsubstituted phenyl group, substituted or unsubstituted heteroaryl group, or substituted or unsubstituted polycyclic group, or any combinations thereof;

(c) α and β are each independently a cyclic structure, an acyclic structure, or mixtures of thereof, wherein the cyclic structure can be a substituted or unsubstituted pyridine group, substituted or unsubstituted phenyl group, substituted or unsubstituted heteroaryl group, substituted or unsubstituted cycloalkyl group, or substituted or unsubstituted polycyclic group, and the acyclic structure can be a substituted or unsubstituted alkynyl, substituted or unsubstituted arylalkynyl, substituted or unsubstituted alkyl, substituted or unsubstituted alkylaryl, substituted or unsubstituted alkoxy, substituted or unsubstituted arylalkoxy, and substituted or unsubstituted derivatives thereof;

(d) each G is independently a non-coordination site, and can be CRR', C=O, NR, O, PR, P(=O)R, BR, S, SO, $SO_2$, SiRR', Se, AsR,

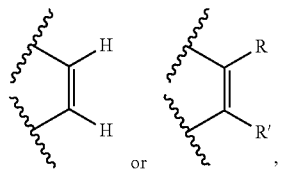

where R and R' are independent selected from hydrogen, halogen, aryl, alkyl, heteroaryl, nitro, trifluoromethyl, cyano, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, a heterocyclic group and derivatives thereof; and (e) p, q, r and s are each independently 0-3.

The luminescent tetradentate gold(III) compounds, according to embodiments of the invention, show strong photoluminescence upon photo-excitation, or EL upon applying a direct current voltage. The tetradentate gold(III) compounds, according to embodiments of the invention, are thermally stable and sufficiently volatile to form a thin layer by sublimation or vacuum deposition. Alternatively, the tetradentate gold(III) compounds can be doped into a host matrix for thin film deposition by spin-coating, inkjet printing, or any other known fabrication method. The tetradentate gold(III) compounds can be used for the fabrication of OLEDs as phosphorescent emitters or dopants to generate EL.

An OLED, according to an embodiment of the invention, employs the luminescent tetradentate gold(III) compound as a light-emitting layer. The OLED comprises the luminescent tetradentate gold(III) compounds and can comprise a layer structure having a cathode layer, an electron transporting layer, the luminescent tetradentate gold(III) compound as the light-emitting layer, a carrier confinement layer, a hole transporting layer, and an anode.

DETAILED DESCRIPTION

Figure 1:
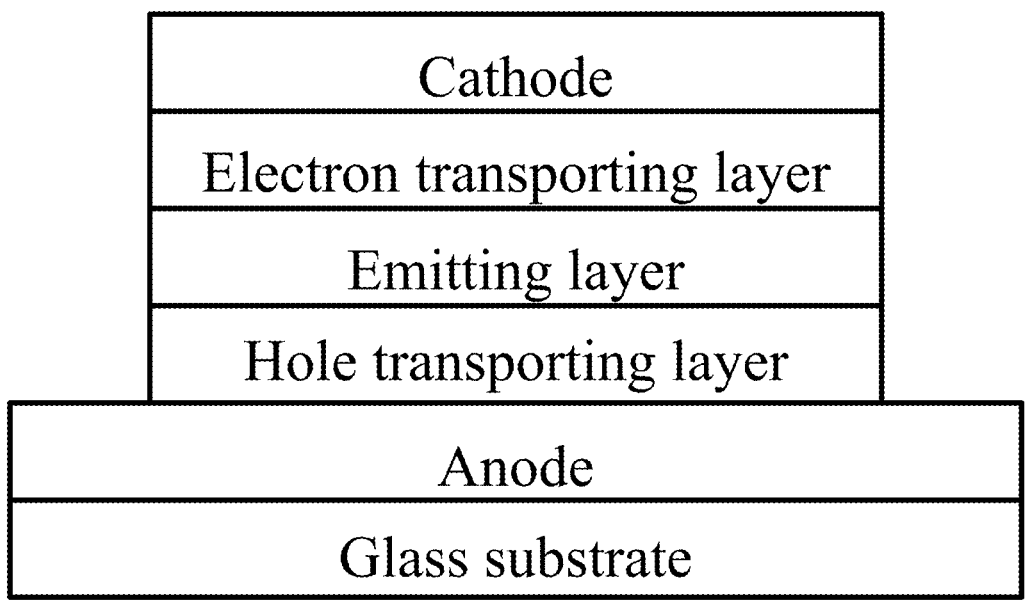
FIG. 1 is a schematic diagram of the basic structure of an organic electroluminescence device, in accordance with an embodiment of the present invention.
Figure 2:
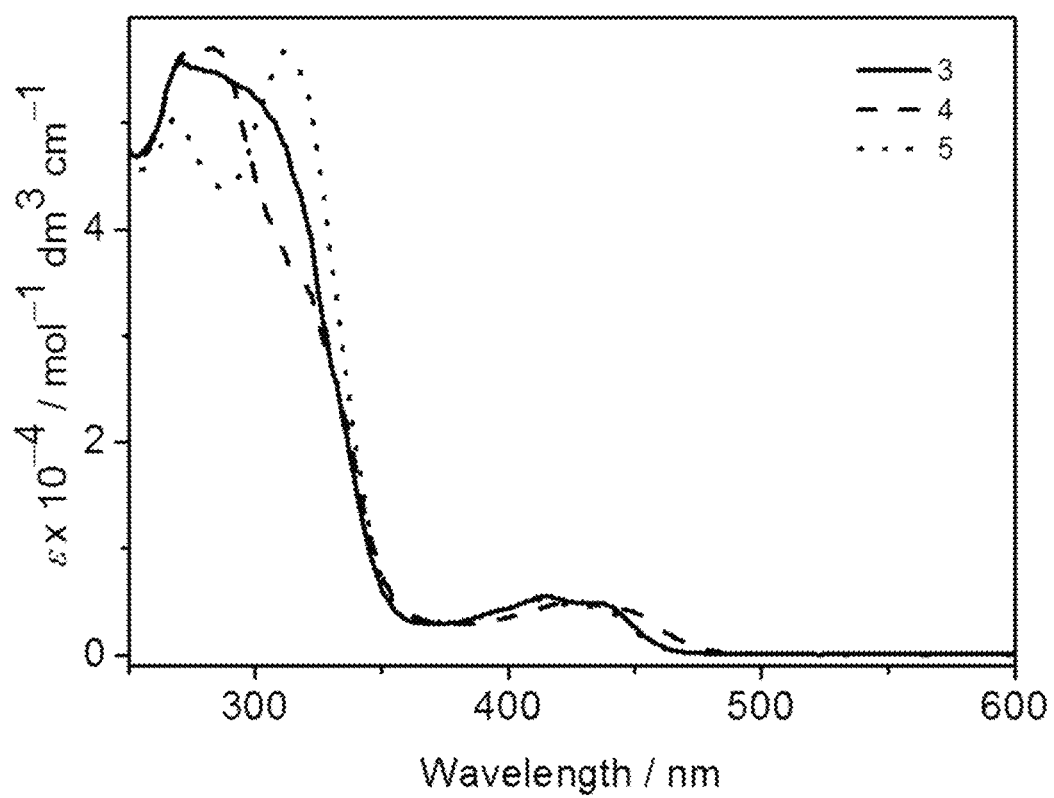
FIG. 2 shows UV-vis absorption spectra of compounds 3-5 in dichloromethane ($CH_2Cl_2$) at 298 K, in accordance with an embodiment of the present invention.
Figure 3:
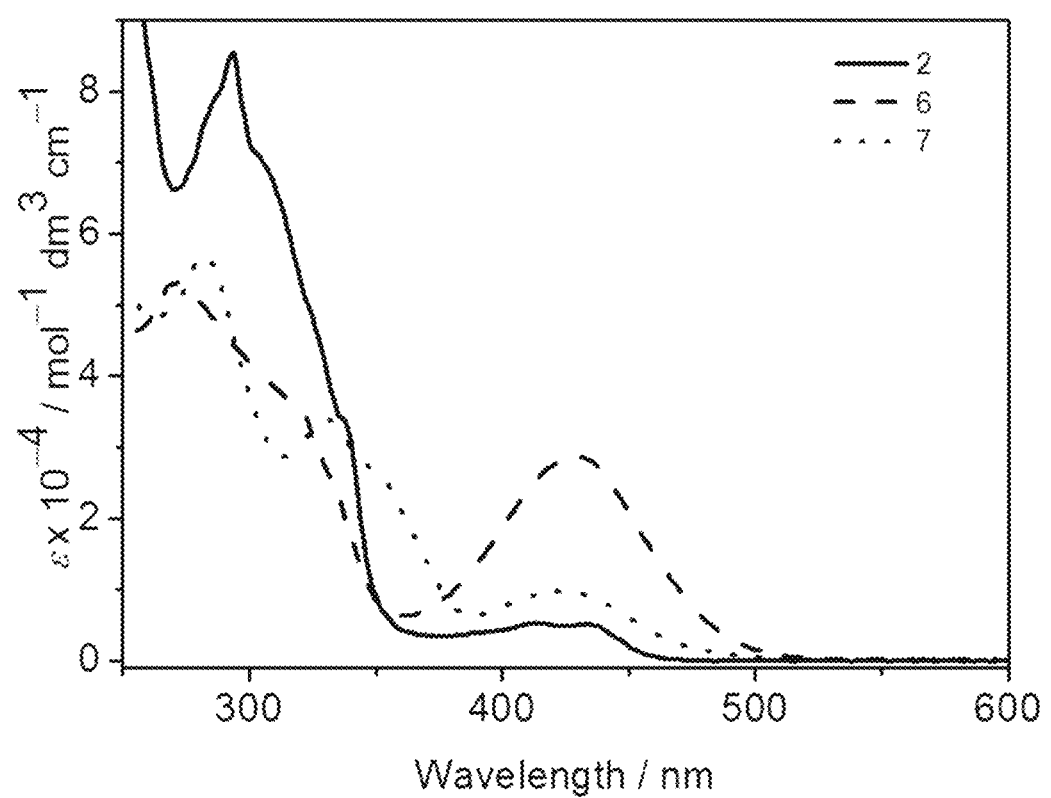
FIG. 3 shows UV-vis absorption spectra of compounds 2, 6 and 7 in dichloromethane at 298 K, in accordance with an embodiment of the present invention.
Figure 4:
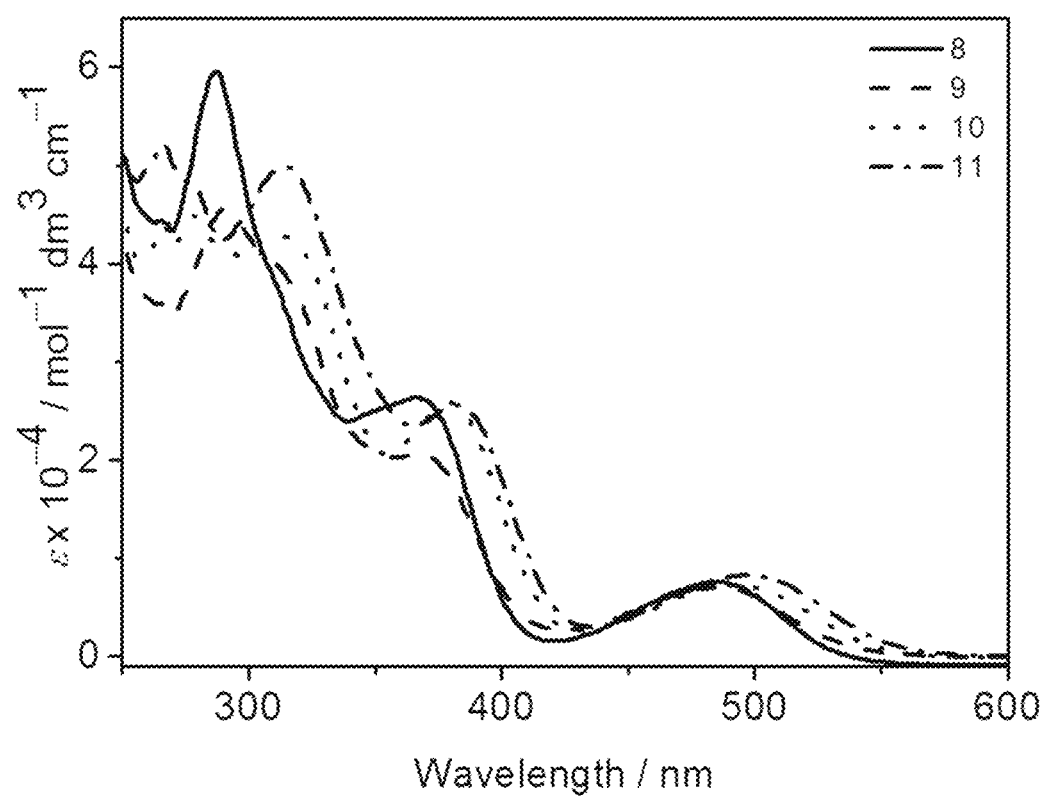
FIG. 4 shows UV-vis absorption spectra of compounds 8-11 in dichloromethane at 298 K, in accordance with an embodiment of the present invention.
Figure 5:
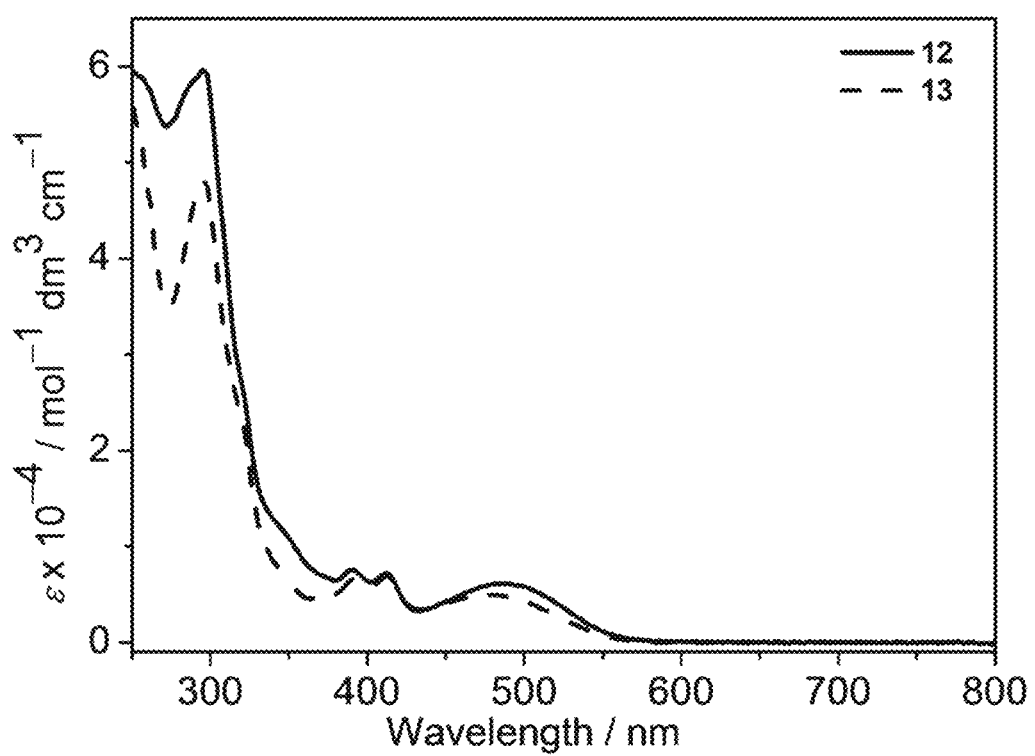
FIG. 5 shows UV-vis absorption spectra of compounds 12 and 13 in dichloromethane at 298 K, in accordance with an embodiment of the present invention.

Embodiments of the invention are directed towards robust luminescent gold(III) compounds comprising tetradentate ligand. Other embodiments of the invention are directed to modification of the luminescent tetradentate gold(III) compounds. The luminescent tetradentate gold(III) compounds comprise:

at least one gold metal center having a +3 oxidation state and four coordination sites;

a tetradentate ligand bearing coordinating atoms or functional groups as ligating site to coordinate to the gold center; and the coordinating sites are connected directly or via an aromatic system or spacer to form a rigid tetradentate ligand having four coordination sites.

The tetradentate gold(III) compounds have the chemical structure shown in Formula I:

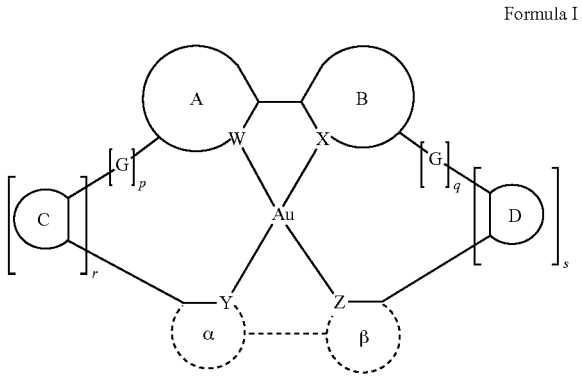

Formula I wherein:

(a) W, X, Y and Z are independently selected from C, O, N, P, C—C≡C(alkynyl), C—N≡C(isocyanide) or C—C≡N (cyanide), where the bold-faced atom represents the coordinating site;

(b) A, B, C and D are independently cyclic derivatives of substituted or unsubstituted pyridine groups, substituted or unsubstituted phenyl groups, substituted or unsubstituted heteroaryl groups, or substituted or unsubstituted polycyclic groups and thereof;

(c) α and β are each independently a cyclic structure, an acyclic structure, or mixtures of thereof, wherein the cyclic structure can be a substituted or unsubstituted pyridine group, substituted or unsubstituted phenyl group, substituted or unsubstituted heteroaryl group, substituted or unsubstituted cycloalkyl group, or substituted or unsubstituted polycyclic group, and the acyclic structure can be a substituted or unsubstituted alkynyl, substituted or unsubstituted aryl- alkynyl, substituted or unsubstituted alkyl, substituted or unsubstituted alkylaryl, substituted or unsubstituted alkoxy, substituted or unsubstituted arylalkoxy, and substituted or unsubstituted derivatives thereof;

(d) each G is independently a non-coordination site, and can be CRR', C═O, NR, O, PR, P(═O)R, BR, S, SO, SO$_2$, SiRR', Se, AsR,

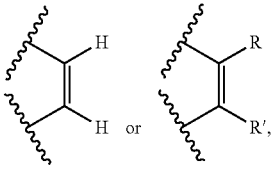

where R and R' are independent selected from hydrogen, halogen, aryl, alkyl, heteroaryl, nitro, trifluoromethyl, cyano, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, a heterocyclic group and derivatives thereof; and (e) p, q, r and s are each independently 0-3.

A, B, C, D, optionally α, and optionally β or in the case of α and β being acyclic structures, rings A, B, C and D are cyclic structure derivatives where the cyclic structures are independently selected from arene, heteroarene, heterocycle or polycyclic unit as known to those skilled in the art. A, B, C, D, optionally α and optionally β can be independently selected from heteroatom containing heteroarenes or heterocycles. The arene or heteroarene can be benzene, pyridine, thiophene, furan, pyrazole, oxadiazole, thiadiazole, imidazole, oxazole, isoxazole, thiazole, isothiazole, isoquinoline, pyrrole, pyrazine, pyridazine, pyrimidine, benzimidazole, benzofuran, benzothiazole, indole, indolocarbazole, benzopyrrolizinophenoxazine, naphthalene, anthracene, pyrene, triazole, tetrazole, pyran, thiapyran, oxadiazole, triazine, tetrazine, carbazole, dibenzothiophene, dibenzofuran, fluorene and derivatives thereof.

A, B, C, D, optionally α, and optionally β can be unsubstituted or substituted with one or more of alkyl, alkenyl, alkynyl, alkylaryl, cycloalkyl, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, aryl or alkyl or heteroaryl ether, diarylamine, dialkylamine, diheteroarylamine, diarylborane, triaryl or trialkylsiliane alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, NRR', SR, C(O)R, COOR, C(O)NR$_2$, SOR, SO$_3$R, BRR' and derivatives thereof; and R and R' are independently selected from hydrogen atom, deuterium atom, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

Additionally, or alternatively, any two adjacent substituted positions of rings A, B, C, D, optionally α, and optionally β, together form, independently, fused 5- to 6-membered cyclic groups, wherein the said cyclic group is cycloalkyl, cycloheteroalkyl, aryl, or heteroaryl, and wherein the fused 5- to 6-member cyclic group can be unsubstituted or be substituted with one or more of alkyl, alkenyl, alkynyl, alkylaryl, cycloalkyl, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, aryl ether, alkyl ether, heteroaryl ether, diarylamine, dialkylamine, diheteroarylamine, diarylborane, triarylsilane, trialkylsiliane alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, NRR', SR, C(O)R, COOR, C(O)NR$_2$, SOR, SO$_3$R, BRR' and derivatives thereof; and R and R' are independently selected from hydrogen atom, deuterium atom, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, aryl ether, alkyl ether, heteroaryl ether, diarylamine, dialkylamine, diheteroarylamine, diarylborane, triarylsilane, trialkylsiliane alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

Specific examples of the luminescent tetradentate gold (III) compounds of Formula I include the following:

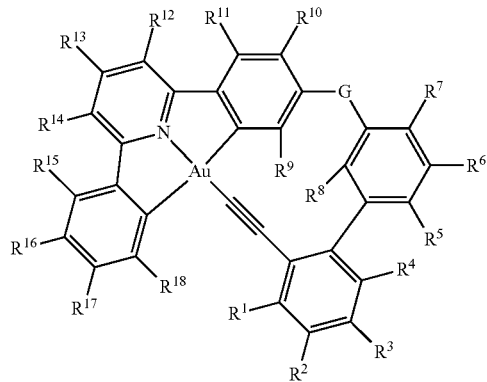

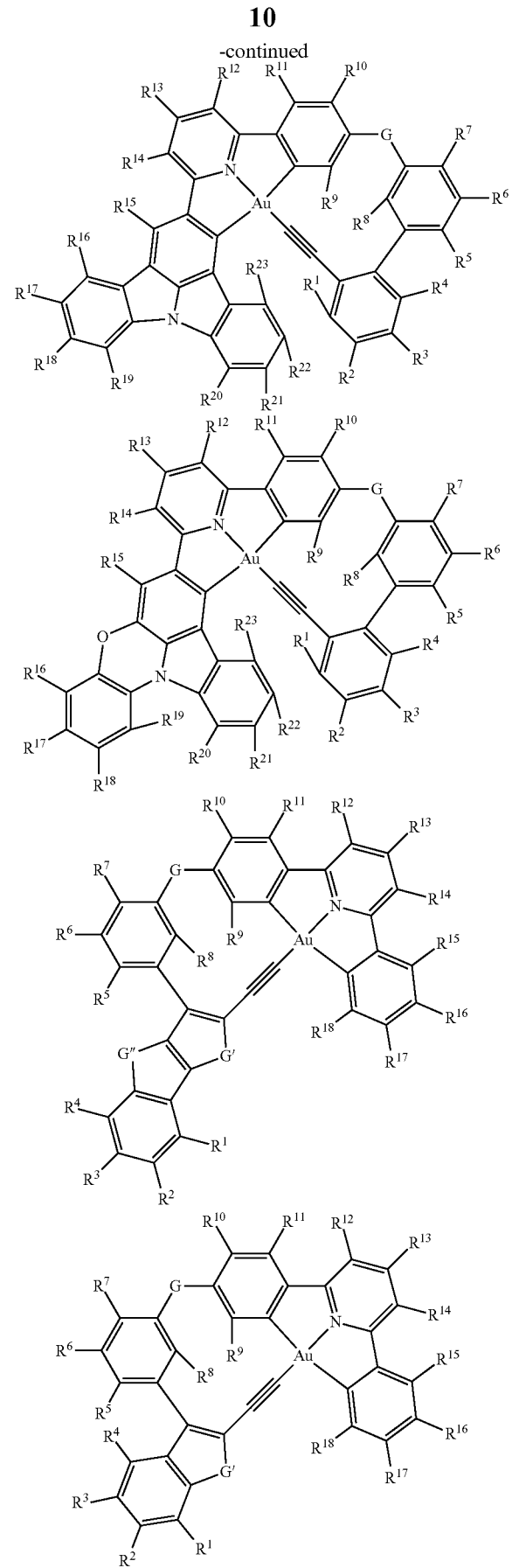

-continued
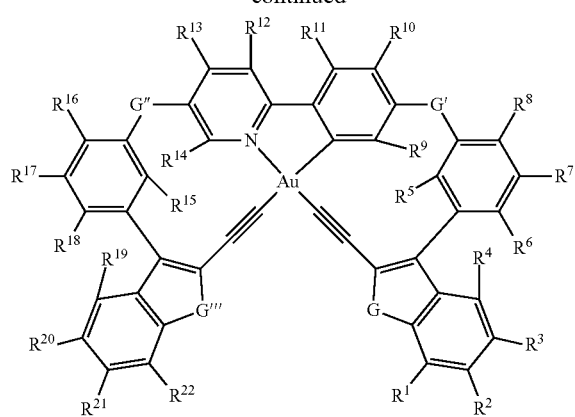
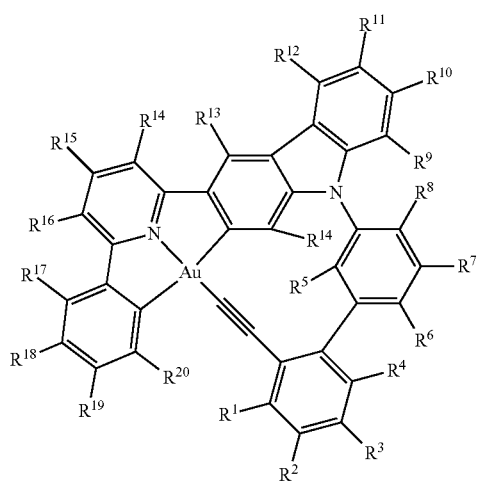
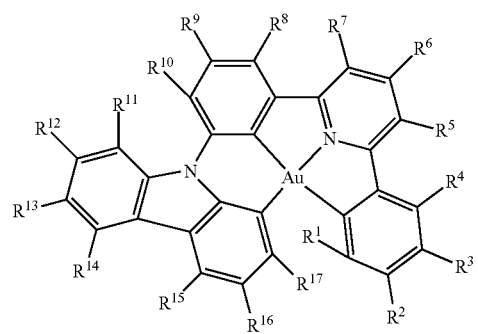
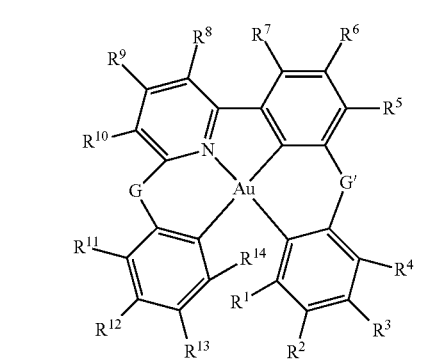
-continued
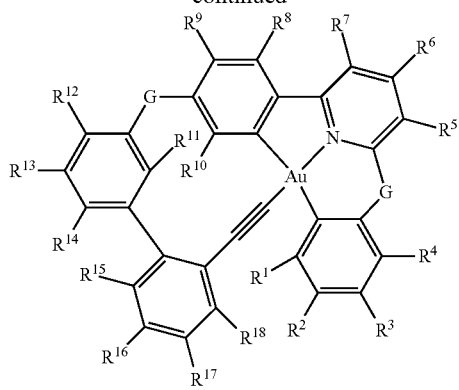
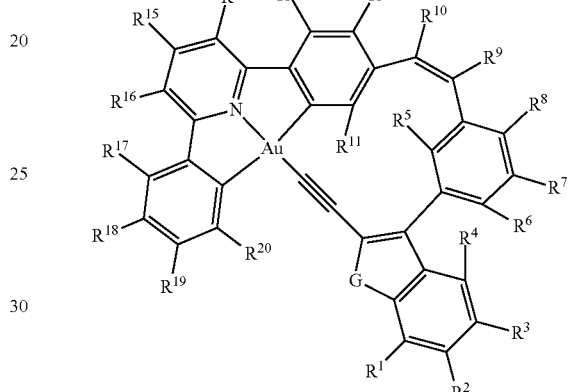
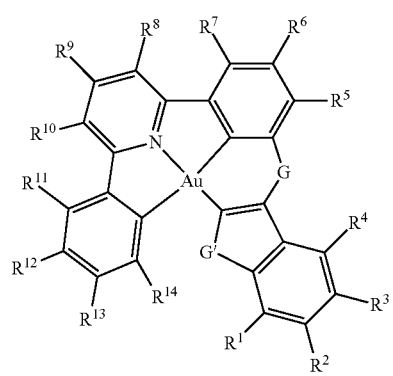
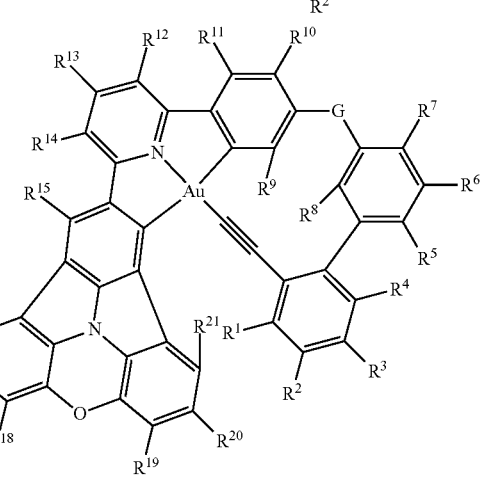

-continued

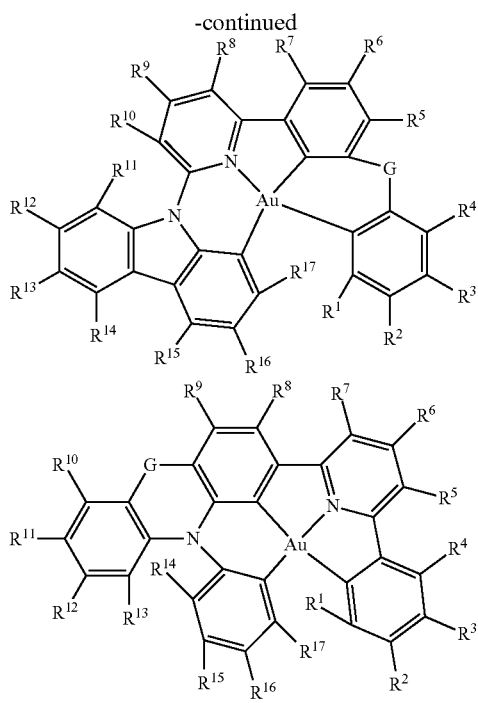

wherein, G, G', G" and G'" are independently selected from CRR', C=O, NR, O, BR, S, SO, SO$_2$, SiRR', Se and AsR, where R and R' are independently selected from hydrogen atom, deuterium atom, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, a heterocyclic group and derivatives thereof; and, le to $R^{23}$ are each independently selected from alkyl, alkenyl, alkynyl, alkylaryl, cycloalkyl, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, aryl ether, alkyl ether, heteroaryl ether, diarylamine, dialkylamine, diheteroarylamine, diarylborane, triarylsilne, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, NRR', SR, C(O)R, COOR, C(O)NR$_2$, SOR, SO$_3$R, BRR' and derivatives thereof; and R and R' are independently selected from hydrogen atom, deuterium atom, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

In the present disclosure the following terms are used.

The term "halo" or "halogen" as used herein includes fluorine, chlorine, bromine and iodine.

The term "alkyl" as used herein includes straight and branched chain alkyl groups, as well as cycloalkyl group with cyclic structure of alkyl groups. Alkyl groups are those containing from one to eighteen carbon atoms and includes methyl, ethyl, propyl, isopropyl, butyl, isobutyl, tert-butyl, and the like. In addition, the alkyl group can be unsubstituted or substituted with one or more substituents including hydrogen atom, deuterium atom, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

The term "alkenyl" as used herein includes both straight and branched chain alkene radicals. Alkenyl groups are those containing two to eighteen carbon atoms. In addition, the alkenyl group can be unsubstituted or substituted with one or more substituents including alkyl, alkenyl, alkynyl, alkylaryl, cycloalkyl, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

The term "alkynyl" as used herein includes alkyne and polyalkyne that have a straight chain of two to eighteen or more carbon atoms. The alkynyl group can be unsubstituted or substituted with one or more substituents including alkyl, alkenyl, alkynyl, alkylaryl, cycloalkyl, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, NRR', SR, C(O)R, COOR, C(O)NR$_2$, SOR, SO$_3$R, BRR' and derivatives thereof; and R and R' are independently selected from hydrogen atom, deuterium atom, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

The term "arylalkynyl" as used herein includes an alkynyl group which has an aromatic group as a substituent. In addition, the arylalkynyl group can be unsubstituted or substituted with one or more substituents including alkyl, alkenyl, alkynyl, alkylaryl, cycloalkyl, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, NRR', SR, C(O)R, COOR, C(O)NR$_2$, SOR, SO$_3$R, BRR' and derivatives thereof; and R and R' are independently selected from hydrogen atom, deuterium atom, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

The term "alkylaryl" as used herein includes an alkyl group which has an aromatic group as a substituent. In addition, the alkylaryl group can be unsubstituted or substituted with one or more substituents including alkyl, alkenyl, alkynyl, alkylaryl, cycloalkyl, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, NRR', SR, C(O)R, COOR, C(O)NR$_2$, SOR, SO$_3$R, BRR' and derivatives thereof; and R and R' are independently selected from hydrogen atom, deuterium atom, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

The term "cycloalkyl" as used herein includes cyclic alkylgroups. Cycloalkyl groups can contain 3 to 7 or more carbon atoms and includes cyclopropyl, cyclopentyl, cyclohexyl, and the like. Cycloalkyl group can be unsubstituted or substituted with one or more substituents including alkyl, alkenyl, alkynyl, alkylaryl, cycloalkyl, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, NRR', SR, C(O)R, COOR, C(O)NR$_2$, SOR, SO$_3$R, BRR' and derivatives thereof; and R and R' are independently selected from hydrogen atom, deuterium atom, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluororomethane, cyano, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

The term "alkoxy" as used herein includes linear or branched alkoxy groups of 1 to 18 or more carbon atoms, and unsubstituted or substituted with one or more substituents including alkyl, alkenyl, alkynyl, alkylaryl, cycloalkyl, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, NRR', SR, C(O)R, COOR, C(O)NR$_2$, SOR, SO$_3$R, BRR' and derivatives thereof; and R and R' are independently selected from hydrogen atom, deuterium atom, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

Aryl alone or in combination includes carbocyclic aromatic systems. The systems may contain one, two or three rings wherein each ring may be attached together in a pendent manner or may be fused. Preferably the rings are 5- or 6-membered rings. Aryl groups include, but are not exclusive to, unsubstituted or substituted derivatives of benzene, naphthylene, pyrene, anthracene, pentacene, benzo[a]pyrene, chrysene, coronene, corannulene, naphthacene, phenanthrene, triphenyklene, ovalene, benzophenanthrene, perylene, benzo[g,h,i]perylene, antanthrene, pentaphene, picene, dibenzo[3,4;9,10]pyrene, benzo[3,4]pyrene, dibenzo[3,4;8,9]pyrene, dibenzo[3,4;6,7]pyrene, dibenzo[1,2;3,4]pyrene, and naphto[2,3;3,4]pyrene; wherein the positions of attachment and substitution can be at any carbon of the group that does not sterically inhibit formation of compound of Formula I, as can be appreciated by one skilled in the art.

Heteroaryl alone or in combination includes heterocyclic aromatic systems. The systems may contain one, two or three rings wherein each ring may be attached together in a pendent manner or may be fused. Preferably the rings are 5- or 6-membered rings. Heterocyclic and heterocycle refer to a 3 to 7-membered ring containing at least one heteroatom. Heteroaryl groups include, but are not exclusive to, unsubstituted or substituted derivatives of pyridine, thiophene, furan, pyrazole, imidazole, oxazole, isoxazole, thiazole, isothiazole, pyrrole, pyrazine, pyridazine, pyrimidine, benzimidazole benzofuran, benzothiazole, benzopyrrolizinophenoxazine, indolocarbazole, oxadiazole, thiadiazole, indole, triazole, tetrazole, pyran, thiapyran, oxadiazole, triazine, tetrazine, carbazole, dibenzothiophene, dibenzofuran, isoindole, quinoline, isoquinoline, chromene, isochromene and non-aromatic rings piperazine, piperidine, pyrrolidine and thereof; wherein the position of attachment or substitution can be at any carbon of the group that does not sterically inhibit formation of compound of Formula I, as can be appreciated by one skilled in the art.

Heteroatom refers to S, O, N, P, Si, B, or Se.

Substituted refers to any level of substitution. Mono-, di- and tri-substitutions are readily prepared. Substituents including hydrogen, halogen, aryl, alkyl, heteroaryl, nitro group, trifluoromethane group, cyano group, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, oxadiazole, thiadiazole, phosphine, phosphate, phosphono, pyridyl, sulfonyl, sulfo, sulfinyl, sulfhydryl, halo, aryl, substituted aryl, heteroaryl, substituted heteroaryl, heterocyclic group and thereof, that are readily prepared.

Benzene includes substituted or unsubstituted benzene. Pyridine includes substituted or unsubstituted pyridine. Thiophene includes substituted or unsubstituted thiophene. Furan includes substituted or unsubstituted furan. Pyrazole includes substituted or unsubstituted pyrazole. Imidazole includes substituted or unsubstituted imidazole. Oxazole includes substituted or unsubstituted oxazole. Isoxazole includes substituted or unsubstituted isoxazole. Thiazole includes substituted or unsubstituted thiazole. Isothiazole includes substituted or unsubstituted isothiazole. Pyrrole includes substituted or unsubstituted pyrrole. Pyrazine includes substituted or unsubstituted pyrazine. Pyridazine includes substituted or unsubstituted pyridazine. Pyrimidine includes substituted or unsubstituted pyrimidine. Benzimidazole includes substituted or unsubstituted benzimidazole. Benzofuran includes substituted or unsubstituted benzofuran. Benzothiazole includes substituted or unsubstituted benzothiazole. Indole includes substituted or unsubstituted indole. Naphthalene includes substituted or unsubstituted naphthalene. Triazole includes substituted or unsubstituted triazole. Tetrazole includes substituted or unsubstituted tetrazole. Pyran includes substituted or unsubstituted pyran. Thiapyran includes substituted or unsubstituted thiapyran. Oxadiazole includes substituted or unsubstituted oxadiazole. Triazine includes substituted or unsubstituted triazine. Tetrazine includes substituted or unsubstituted tetrazine. Carbazole includes substituted or unsubstituted carbazole. Dibenzothiophene includes substituted or unsubstituted dibenzothiophene. Dibenzofuran includes substituted or unsubstituted dibenzofuran. Piperazine includes substituted or unsubstituted piperazine. Piperidine includes substituted or unsubstituted piperidine. Pyrrolidine includes substituted or unsubstituted pyrrolidine. Indolocarbazole includes substituted or unsubstituted indolocarbazole. Benzopyrrolizinophenoxazine includes substituted or unsubstituted benzopyrrolizinophenoxazine. Oxadiazole includes substituted or unsubstituted oxadiazole. Thiadiazole includes substituted or unsubstituted thiadiazole.

Embodiments of the invention are illustrated, but not limited to, the following examples. It is to be understood that changes and variations can be made therein without deviating from the scope and the spirit of the invention as hereinafter claimed. It is also understood that various theories as to why the invention works are not intended to be limiting. Unless otherwise indicated in the following examples and elsewhere in the specification and claims, all parts and percentages are by weight, all temperatures are in degrees Centigrade, and pressure is at or near atmospheric pressure.

In some embodiments of the invention, the luminescent tetradentate gold(III) compounds of Formula I are prepared in high purity. The compounds are represented throughout by their monomeric structure. As is well known to those skilled in the art, the compounds may also be present as dimers, trimers, oligomers or dendrimers, where two or more substituents can be coupled by an addition or condensation reaction between two or more tetradentate gold(III) compounds or the tetradentate gold(III) compounds and a divalent or polyvalent reagent, such a, but not limited to, an alklene, diaminoalkane, dihydroxyalkane, dicarboxyalkane, diaminoarene, dihydroxyarene, or dicarboxyarene. Reactions that can be used include, but are not limited to, olefin metathesis, a alkene oligomerization or polymerization, amidation, esterification, urethane formation, urea formation, and eterification.

The luminescent tetradentate gold(III) compounds can be used to form thin films by spin-coating, vacuum deposition or other known fabrication methods and be applied in OLEDs. Referring to FIG. 1, an organic EL device has, in order, substrate, hole-injecting anode, hole transporting layer, light-emitting layer, electron transporting layer, and electron-injecting cathode. The substrate is electrically insulated and can be either optically transparent, comprising glass, plastic foil, or other appropriate material. Alternatively, the substrate may be opaque and comprises one or more semiconducting materials or ceramics. In one embodiment of the invention, the EL emission is viewed through the substrate, or through both sides of the device, and the substrate comprises a transparent glass substrate or a plastic foil. In other embodiments of the invention, the EL emission is viewed only through the top electrode, and the substrate comprises an opaque semiconductor or ceramic wafers. Hole-injecting anode injects holes into the organic electroluminescence layer when anode is positively biased. The anode is composed of a conductive and optionally transmissive layer. In one embodiment of the invention, the EL emission is viewed through the substrate and the hole-injecting anode is transparent. In another embodiment of the invention, the EL emission is viewed through the top electrode and the transmissive characteristics of anode are immaterial and, therefore, any appropriate materials including metals or metal compounds having a work function of greater than 4.1 eV. Appropriate metals include gold, iridium, molybdenum, palladium, and platinum. When the anode is transmissive, suitable materials are metal oxides, including ITO, aluminum- or indium-doped zinc oxide, tin oxide, magnesium-indium oxide, nickel-tungsten oxide, and cadmium-tin oxide. The preferred metals and metal oxides can be deposited by evaporation, sputtering, laser ablation, and chemical vapor deposition. Suitable materials for a hole-transporting layer include polycyclic aromatic compounds, for example, but not limited to, 4,4'-bis[N-(1-naphthyl)-N-phenylamino]biphenyl (NPB), 4,4'-bis[N-(3-methylphenyl)N-phenylamino]biphenyl (TPD), 4,4',4''-tris[(3-methylphenyl)phenylamino] triphenylamine (MTD-ATA), and di-[4-(N,N-ditolyl-amino)phenyl]cyclohexane (TAPC). Polymeric hole-transporting materials can be used, including, but not limited to, poly(N-vinylcarbazole) (PVK), polythiophene, polypyrrole, polyaniline, and copolymers including poly(3,4-ethylenedioxythiophene):poly(4-styrene-surlfonate) (PEDOT:PSS).

The light-emitting layer in FIG. 1 is formed by doping the phosphorescent gold(III) compounds as a dopant into a host compound. Suitable host materials should be selected so that the triplet exciton can be transferred efficiently from the host material to the phosphorescent dopant material. Suitable host materials include certain aryl amines, triazoles and carbazole compounds. Examples of desirable hosts are CBP, MCP, 3-(4-biphenylyl)-4-phenyl-5-tert-butylphenyl-1,2-butylphenyl-1,2,4-triazole (TAZ) 4,4',4''-tris(carbazol-9-yl) triphenylamine (TCTA), p-bis-(triphenylsilyl)benzene (UGH2), and PVK.

The electron-transporting layer consists of materials or mixtures of materials having a high ionization potential and wide optical band gap. Suitable electron-transporting materials include, but are not limited to bis(2-methyl-8-quinolinolate)-4-(phenylphenolate) aluminum (BAlq), bathocuproine (BCP), 1,3,5-tris(phenyl-2-benzimidazolyl)-benzene (TPBI), 1,3,5-tri[(3-pyridyl)-phen-3-yl]benzene (TmPyPB), bathophenanthroline (BPhen) and tris-[2,4,6-trimethyl-3-(pyridin-3-yl)phenyl]borane (3TPyMB), and 1,3-bis[3,5-di(pyridin-3-yl)phenyl]benzene (BmPyPhB). In an embodiment of the invention, the electron transporting layer is prepared from an organic film by thermal evaporation, spin-coating, ink-jet printing from a solution, or other known fabrication methods. The electron-injecting cathode acts as a transmissive electron injector that injects electrons into the organic electroluminescence layer of anode when the cathode is negatively biased. The cathode optionally comprises a thin fluoride layer and a metal or metal alloy, preferably having a work function of less than 4 eV. Suitable materials include Mg:Ag, Ca, Li:Al, Al.

In some embodiments of the invention, luminescent tetradentate gold(III) compounds are a primary luminescent material or a secondary luminescent material in device, as shown in FIG. 1. In some embodiments of the invention, the tetradentate gold(III) compounds are employed as electrophosphorescent dopants in multilayer OLED with an EQE of up to 11.1%. Advantageously, the tetradentate gold(III) compounds can be deposited in the OLEDs by spin-coating, screen printing, ink-jet printing and vacuum deposition. In addition, the modular molecular design of tetradentate gold (III) compounds, as shown in Formula I, allows independent optimization of electronic and processing properties producing OLEDs having various emission colors.

In general, the emissive layer is sandwiched between the hole-transporting layer and the electron-transporting layer. To ensure an efficient exothermic energy transfer between the host material and the dopant material, the triplet energy of the host material is larger than that of the dopant material. In addition, the ionization potential and the electron affinity of the host material is larger than those of the dopant material in order to achieve efficient Foster resonance energy transfer from the host to the dopant. In order to confine triplet excitons within emissive layer, the triplet energy of the hole-transporting material and electron-transporting material is larger than that of the dopant material.

In some embodiments of the invention, the luminescent tetradentate gold(III) compounds of Formula I are prepared in high purity. The synthetic method involves providing the luminescent tetradentate gold(III) compounds of Formula I from the cyclomatelated gold(III) precursor compounds or their equivalents. The gold(III) precursor compounds can be prepared by any methods known to those skilled in the art, for example, but not limited to, the methods disclosed in Krohnke, F. *Synthesis* 1 (1976); Wong, K. H.; Cheung, K. K.; Chan, M. C.; Che, C. M. *Organometallics,* 17, 5305 (1998); Yam, V W.-W.; Wong, K. M.-C.; Hung, L.-L.; Zhu, N. *Angew. Chem. Int. Ed.* 44, 3107 (2005); Au, V K.-M.; Wong, K. M.-C.; Zhu, N.; Yam, V W.-W. *Chem. Eur. J.* 17, 130 (2011); Roşca, D.-A.; Smith, D. A.; Bochmann, M. *Chem. Comm.* 48, 7247 (2012); David, B.; Monkowius, U.; Rust, J.; Lehmann, C. W.; Hyzak, L.; Mohr, F. *Dalton Trans.* 43, 11059 (2014); Maity, A.; Sulicz, A. N.; Deligonul, N.; Zeller, M.; Hunter, A. D.; Gray, T. G. *Chem. Sci.* 6, 981 (2015); Kumar, R.; Linden, A.; Nevado, C. *Angew. Chem. Int. Ed.* 54, 14287 (2015).

The target compounds can be synthesized by intramolecular cyclization, for example gold(III) precursor compounds undergo intramolecular cyclization reaction in the presence of base(s) or the intramolecular cyclization reaction in the presence of one or more catalyst or in the presence of both base and catalyst, as shown in Schemes 1-4, wherein the base is an organic base or inorganic base and the catalyst can be metal-based catalyst, organic-based catalyst, organometallic-based catalyst or mixtures thereof. Although the method can vary depending upon the ligand, in general the reaction is carried out in solution. The reactions are generally carried out above room temperature, for example 90° C. Specific conditions of solvent and temperature vary depending upon the structure of the desired gold(III) compound, as can be appreciated by those skilled in the art.

In some parts of the invention, the tetradentate gold(III) compounds can be further modified by incorporation of the substituents to the tetradentate gold(III) compounds, as can be appreciated upon inspection of Scheme 3.

In some parts of the invention, purification can be carried out by any method or combination of methods, including chromatography, extraction, crystallization, sublimation or any combination thereof.

Example 1

Compounds 1-13 and 6p were prepared according to the following methodology as illustrated in Scheme 1, whereas compound 6 was prepared according to Scheme 2. The precursor compounds were prepared as disclosed in Yam, V. W.-W.; Wong, K. M.-C.; Hung, L.-L.; Zhu, N. *Angew. Chem. Int. Ed.* 44, 3107 (2005). All the tetradentate complexes were synthesized by cyclization reaction of the respective precursor compounds with $Cs_2CO_3$, or with $NaO^tBu$, $Pd_2(dba)_3$ and phosphine ligand(s). Modification of the tetradentate compound 6p to compound 6 was carried out by Buchwald-Hartwig amination using $NaO^tBu$, $Pd_2(dba)_3$ and phosphine ligand(s). For example, to prepare compound 1, degassed dimethylformamide (DMF) was added to the flask containing the precursor of compound 1 and $Cs_2CO_3$, and the reaction mixture was heated to 90° C. for 2 days. The crude product was purified by column chromatography on silica gel using dichloromethane and hexane as eluent. Yellow crystals were obtained from layering of methanol onto the concentrated ethyl acetate solution of the compounds.

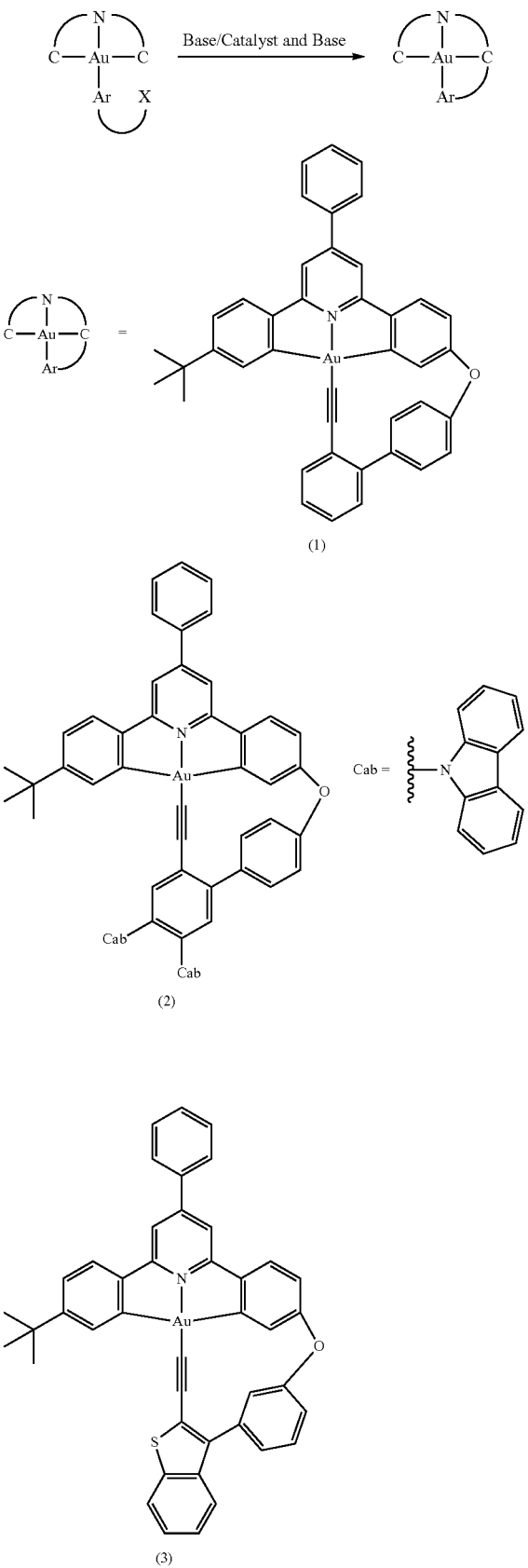

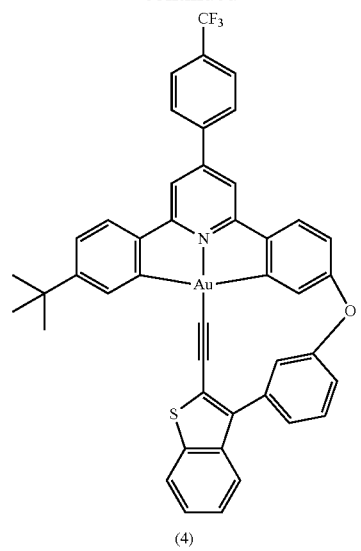
(4)
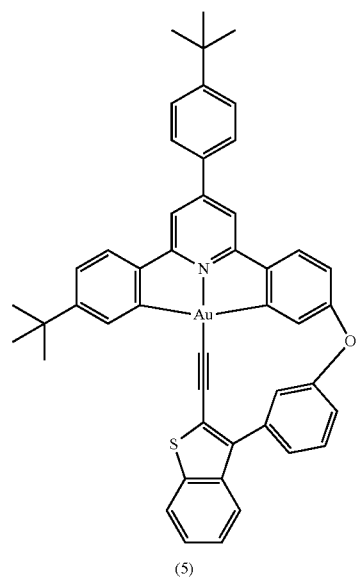
(5)
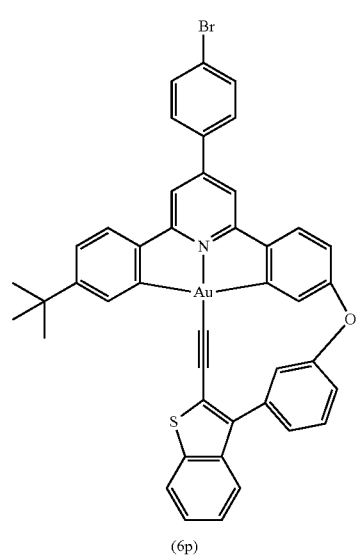
(6p)
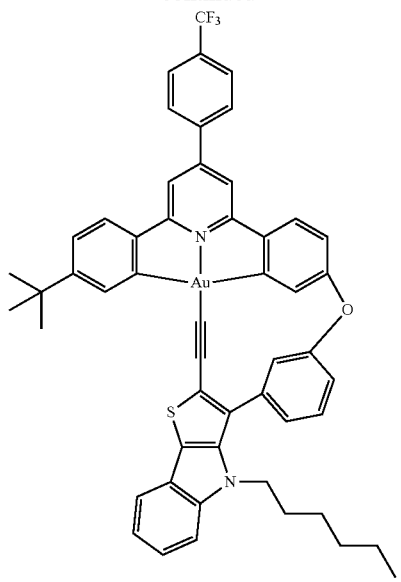
(7)
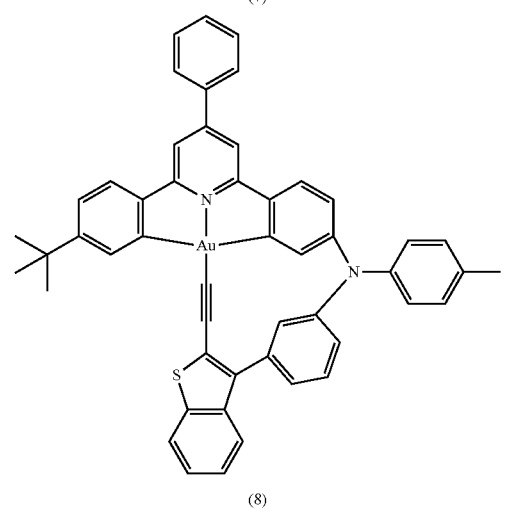
(8)
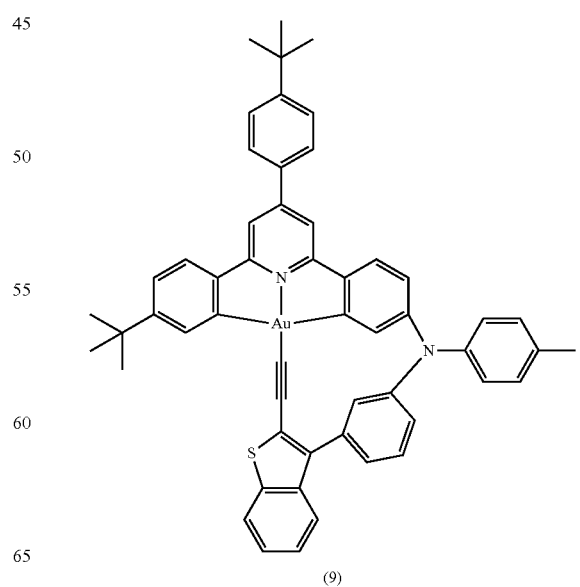
(9)

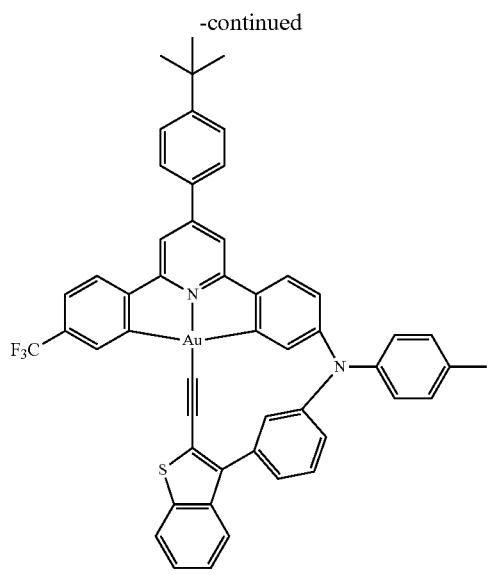
(10)
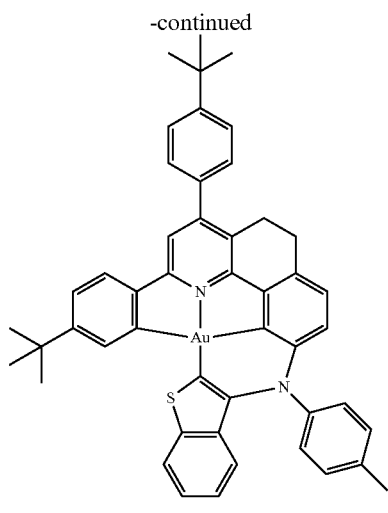
(12)
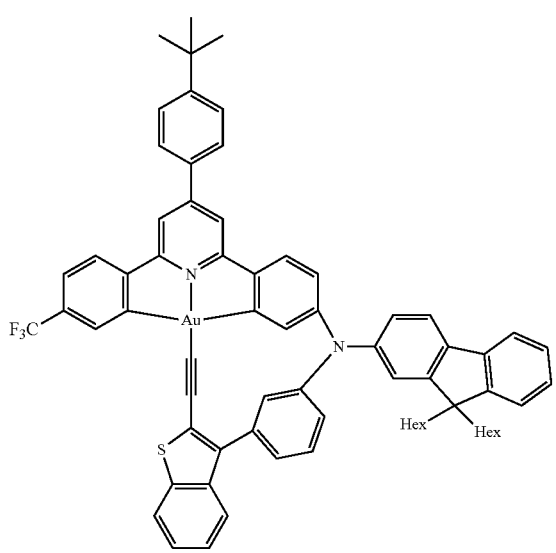
(11)
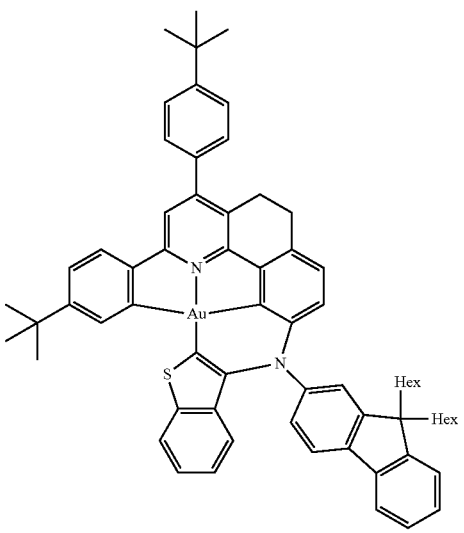
(13)

Scheme 2

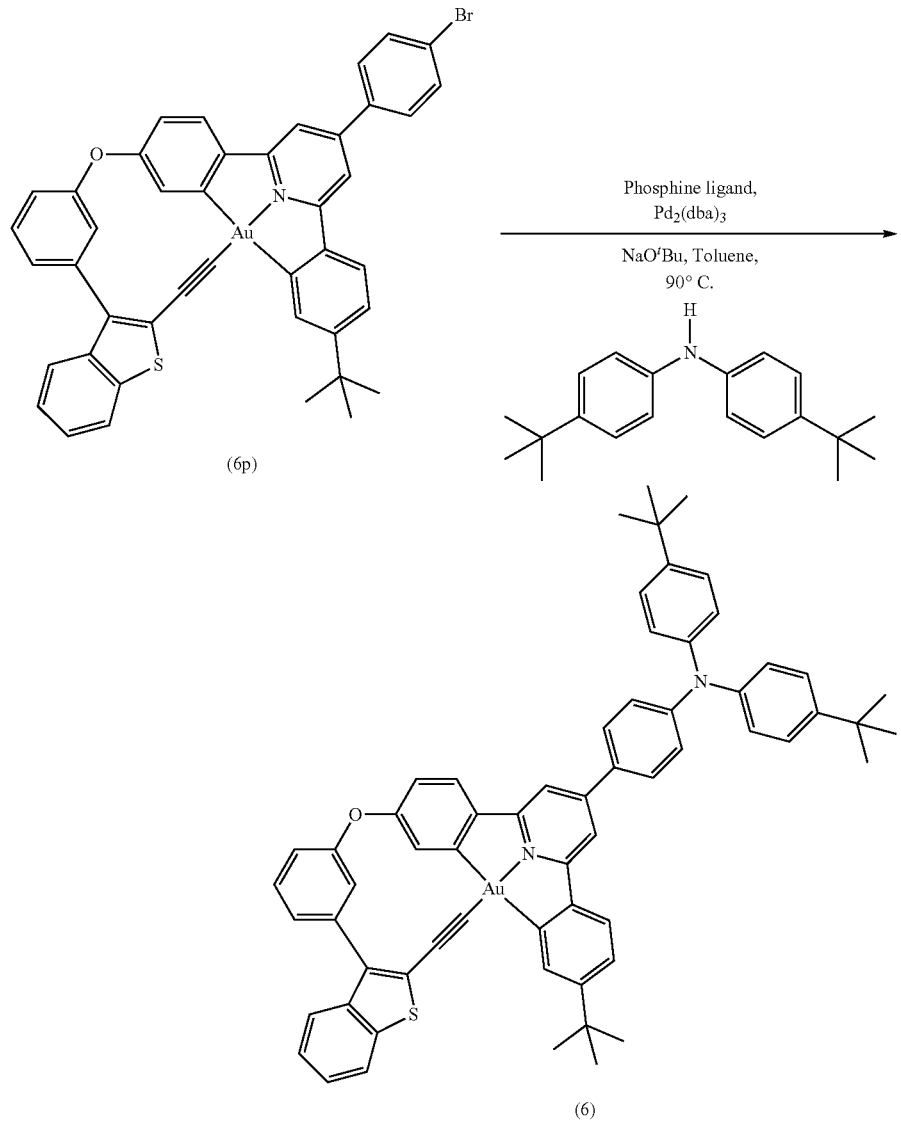

The characteristic spectroscopic properties of compounds 1-13 and 6p are as follows:

Compound 1: Yield: 110 mg, 65%. $^1$H NMR (400 MHz, CDCl$_3$): δ 1.41 (s, 9H) 6.88-6.94 (m, 1H), 7.17 (d, J=7.8 Hz), 7.22 (d, J=8.0 Hz, 1H), 7.26-7.29 (m, 1H), 7.31-7.36 (m, 2H), 7.39-7.49 (m, 5H), 7.49-7.55 (m, 4H) 7.68-7.73 (m, 2H), 7.75-7.79 (m, 1H), 7.88 (s, 1H), 8.08 (s, 1H), 8.77-8.79 (m, 1H). Positive FAB-MS: m/z 750 ([M+H]$^+$).

Compound 2: Yield: 90 mg, 42%. $^1$H NMR (400 MHz, CD$_2$Cl$_2$): δ 1.43 (s, 9H), 6.58-6.62 (m, 1H), 7.00-7.02 (m, 1H), 7.07-7.09 (m, 2H), 7.10-7.13 (m, 6H), 7.14-7.22 (m, 4H), 7.29-7.35 (m, 4H), 7.37-7.38 (m, 3H), 7.41-7.42 (m, 1H), 7.43-7.53 (m, 4H), 7.54-7.59 (m, 2H), 7.84-7.90 (m, 4H), 8.01 (s, 1H), 8.05 (s, 1H), 8.11 (s, 1H), 8.80-8.83 (m, 1H). Positive FAB-MS: m/z 1080 ([M+H]$^+$).

Compound 3: Yield: 87 mg, 51%. $^1$H NMR (400 MHz, [D$_6$]-DMSO): δ 1.28 (s, 9H), 6.41 (dd, J=8.5, 2.6 Hz, 1H), 7.14 (d, J=2.6 Hz, 1H), 7.20-7.26 (m, 2H), 7.31-7.37 (m, 3H), 7.37-7.44 (m, 4H), 7.47-7.50 (m, 2H), 7.53-7.60 (m, 5H), 7.76 (d, J=8.5 Hz, 1H), 7.81-7.85 (m, 1H), 7.93-7.96 (m, 1H), 8.12-8.15 (m, 1H). Positive FAB-MS: m/z 806 ([M+H]$^+$). Elemental analysis calcd (%) for C$_{43}$H$_{30}$AuNOS·0.5H$_2$O: C, 63.39; H, 3.84; N, 1.72; found: C, 63.41; H, 3.77; N, 1.90.

Compound 4: Yield: 96 mg, 50%. $^1$H NMR (400 MHz, CDCl$_3$): δ 1.28 (s, 9H), 6.56 (dd, J=8.5, 2.6 Hz), 6.88-6.90 (m, 1H), 6.95-6.97 (m, 1H), 7.11-7.15 (m, 1H), 7.17 (d, J=8.5 Hz, 1H), 7.23-7.25 (m, 1H) 7.29-7.33 (m, 1H) 7.36-7.48 (m, 7H) 7.69 (d, J=8.3 Hz, 2H), 7.78-7.82 (m, 1H), 7.92 (d, J=2.6 Hz, 1H), 7.93-7.98 (m, 1H), 8.26-8.30 (m, 1H). $^{19}$F{$^1$H} NMR (376 MHz, CDCl$_3$): δ −61.52 (s). Positive FAB-MS: m/z 874 ([M+H]$^+$). Elemental analysis calcd (%) for C$_{44}$H$_{29}$AuF$_3$NOS·H$_2$O: C, 59.26; H, 3.50; N, 1.57; found: C, 59.39; H, 3.37; N, 1.87.

Compound 5: Yield: 80 mg, 57%. $^1$H NMR (400 MHz, CDCl$_3$): δ 1.38 (s, 9H), 1.44 (s, 9H), 6.57 (dd, J=8.5, 2.6 Hz, 1H), 6.80-6.82 (m, 1H), 6.91-6.93 (m, 1H), 7.08 (d, J=8.5 Hz, 1H), 7.10-7.14 (m, 1H), 7.16-7.20 (m, 2H), 7.21 (s, 1H), 7.24 (d, J=2.0 Hz, 1H), 7.33-7.41 (m, 5H), 7.43 (d, J=8.4 Hz, 2H), 7.78-7.81 (m, 1H), 7.82 (d, J=2.6 Hz, 1H), 7.91-7.96 (m, 1H), 8.24-8.26 (m, 1H). Positive FAB-MS: m/z 862 ([M+H]$^+$).

Compound 6p: Yield: 98 mg, 59%. $^1$H NMR (400 MHz, CDCl$_3$): δ 1.39 (s, 9H), 6.51-6.57 (m, 1H), 6.78-6.90 (m, 2H), 7.07-7.17 (m, 3H), 7.19-7.24 (m, 2H), 7.36-7.40 (m, 2H), 7.42-7.51 (m, 4H), 7.53-7.60 (m, 2H), 7.78-7.82 (m, 1H), 7.90-7.93 (m, 2H), 8.32-8.34 (m, 1H). Positive FAB-MS: m/z 884 ([M+H]$^+$).

Compound 6: Yield: 56 mg, 43%. $^1$H NMR (400 MHz, CDCl$_3$): δ 1.35 (s, 27H), 6.52 (dd, J=8.5, 2.6 Hz, 1H), 6.85 (d, J=8.8 Hz, 2H), 7.02 (d, J=8.8 Hz, 2H), 7.10-7.14 (m, 5H), 7.15-7.19 (m, 5H), 7.34-7.39 (m, 6H), 7.44 (d, J=2.6 Hz, 1H), 7.45-7.50 (m, 2H), 7.77-7.82 (m, 1H), 7.90-7.92 (s, 1H), 7.95-7.99 (m, 1H), 8.34-8.36 (m, 1H). Positive FAB-MS: m/z 1085 ([M+H]$^+$).

Compound 7: Yield: 50 mg, 43%. $^1$H NMR (400 MHz, [D$_6$]-DMSO): δ 0.69 (m, 3H), 0.82-1.08 (m, 8H), 1.34 (s, 9H), 4.15 (t, J=7.0 Hz, 2H), 6.45 (dd, J=8.5, 2.6 Hz, 1H), 7.07 (d, J=2.6 Hz, 1H), 7.13 (t, J=7.9 Hz, 1H), 7.20-7.31 (m, 3H), 7.327-7.37 (m, 1H), 7.44-7.48 (m, 1H), 7.51 (d, J=8.5 Hz, 1H), 7.55 (t, J=7.9 Hz, 1H), 7.68 (d, J=8.2 Hz, 2H), 7.70-7.75 (m, 3H), 7.80 (s, 1H), 7.84-7.86 (m, 1H), 7.89 (d, J=7.9 Hz, 1H), 7.93 (d, J=8.2 Hz, 2H). $^{19}$F{$^1$H} NMR (376 MHz, [D$_6$]-DMSO): δ −61.39 (s). Positive FAB-MS: m/z 997 ([M+H]$^+$).

Compound 8: Yield: 104 mg, 68%. $^1$H NMR (400 MHz, CDCl$_3$): δ 1.40 (s, 9H), 2.44 (s, 3H), 6.52 (dd, 1H, J=8.6, 2.8 Hz), 6.74-6.76 (m, 1H), 7.21-7.25 (m, 2H), 7.26-7.36 (m, 8H), 7.36-7.41 (m, 2H), 7.47-7.55 (m, 4H), 7.66-7.71 (m, 2H), 7.75-7.80 (m, 1H), 7.86-7.90 (m, 1H), 8.05 (d, J=2.0 Hz, 1H), 8.36-8.42 (m, 1H), 9.06 (d, J=2.8 Hz, 1H). Positive FAB-MS: m/z 895 ([M+H]$^+$). Elemental analysis calcd (%) for C$_{50}$H$_{36}$AuN$_2$S·H$_2$O: C, 65.78; H, 4.31; N, 3.07; found: C, 65.77; H, 4.04; N, 3.12.

Compound 9: Yield: 110 mg, 67%. $^1$H NMR (400 MHz, CDCl$_3$) δ 1.38 (s, 9H), 1.43 (s, 9H), 2.45 (s, 3H), 6.55 (dd, J=8.6, 2.8 Hz, 1H), 6.78-6.82 (m, 1H), 7.26-7.29 (m, 1H), 7.32-7.35 (m, 5H), 7.35-7.40 (m, 5H), 7.49-7.51 (m, 1H), 7.58 (d, J=8.5 Hz, 2H), 7.63 (d, J=8.6 Hz, 1H), 7.70 (d, J=8.5 Hz, 2H), 7.81-7.90 (m, 2H), 8.04-8.06 (m, 1H), 8.39-8.41 (m, 1H), 9.04 (d, J=2.8 Hz, 1H). Positive FAB-MS: m/z 951 ([M+H]$^+$). Elemental analysis calcd (%) for C$_{54}$H$_{45}$AuN$_2$S·0.5H$_2$O: C, 67.56; H, 4.83; N, 2.92; found: C, 67.60; H, 4.84; N, 2.98.

Compound 10: Yield: 108 mg, 72%. $^1$H NMR (400 MHz, CDCl$_3$): δ 1.31 (s, 9H), 2.44 (s, 3H), 6.47 (dd, J=8.6, 2.8 Hz, 1H), 6.71-6.75 (m, 1H), 7.04-7.08 (m, 1H), 7.16-7.19 (m, 1H), 7.21-7.24 (m, 2H), 7.27-7.31 (m, 3H), 7.31-7.36 (m, 2H), 7.36-7.41 (m, 3H), 7.43 (d, J=8.4, 2H), 7.55-7.62 (m, 3H), 7.77-7.80 (m, 1H), 7.80-7.84 (m, 1H), 8.11 (m, 1H), 8.23-8.26 (m, 1H), 8.88 (d, J=2.8 Hz, 1H). $^{19}$F{$^1$H} NMR (376 MHz, CDCl$_3$): δ −62.47 (s). Positive FAB-MS: m/z 963 ([M+H]$^+$). Elemental analysis calcd (%) for C$_{51}$H$_{36}$AuF$_3$N$_2$S·0.5H$_2$O: C, 63.03; H, 3.84; N, 2.88; found: C, 63.01; H, 3.79; N, 3.01.

Compound 11: Yield: 110 mg, 99%. $^1$H NMR (400 MHz, CDCl$_3$): δ 0.63-0.91 (m, 10H), 1.03-1.20 (m, 12H), 1.36 (s, 9H), 1.90-2.03 (m, 4H), 6.65 (dd, J=8.6, 2.8 Hz, 1H), 6.75-6.79 (m, 1H), 7.20-7.25 (m, 2H), 7.27-7.29 (m, 1H), 7.34-7.39 (m, 5H, C"N"T), 7.39-7.45 (m, 3H) 7.45-7.49 (m, 2H), 7.51 (d, J=8.5 Hz, 2H), 7.62 (d, J=8.5 Hz, 2H), 7.68 (d, J=8.6 Hz, 1H), 7.71-7.74 (m, 1H), 7.77-7.81 (m, 2H), 7.87-7.91 (m, 1H), 8.18-8.22 (m, 1H), 8.34-8.37 (m, 1H), 9.07 (d, J=2.8 Hz, 1H. $^{19}$F{$^1$H} NMR (376 MHz, CDCl$_3$): δ −62.53 (s). Positive FAB-MS: m/z 1205 ([M+H]$^+$). Elemental analysis calcd (%) for C$_{69}$H$_{62}$AuF$_3$N$_2$S·H$_2$O: C, 67.75; H, 5.27; N, 2.29; found: C, 67.99; H, 5.24; N, 2.44.

Compound 12: Yield: 120 mg, 65%. $^1$H NMR (400 MHz, CDCl$_3$): δ 1.41 (s, 9H), 1.52 (s, 9H), 2.47 (s, 3H), 3.02-3.08 (m, 4H), 6.87-6.91 (m, 1H), 6.93-6.98 (m, 1H), 6.99-7.03 (m, 1H), 7.15-7.20 (m, 1H), 7.30-7.35 (m, 3H), 7.35-7.40 (m, 3H), 7.45 (d, J=8.4 Hz, 2H), 7.50 (s, 1H), 7.58 (d, J=8.4 Hz, 2H), 7.72 (d, J=8.2 Hz, 1H), 7.83-7.88 (m, 1H), 8.77 (d, J=1.9 Hz, 1H). HRMS (Positive ESI) calcd. for C$_{48}$H$_{43}$AuN$_2$S: m/z=876.2807; found: 976.2793 [M]$^+$.

Compound 13: Yield: 200 mg, 70%. $^1$H NMR (400 MHz, CDCl$_3$): δ 0.57-0.72 (m, 4H), 0.75 (t, J=7.1 Hz, 6H), 0.96-1.03 (m, 8H), 1.05-1.14 (m, 4H), 1.39 (s, 9H), 1.53 (s, 9H), 1.89-2.00 (m, 4H), 2.95-3.06 (m, 4H), 6.68 (d, J=8.2 Hz, 1H), 6.74-6.79 (m, 1H), 6.88 (d, J=8.7 Hz, 1H), 7.06-7.11 (m, 1H), 7.19 (d, J=8.7 Hz, 1H), 7.31-7.34 (m, 1H), 7.35-7.37 (m, 3H), 7.37-7.40 (m, 3H), 7.41 (s, 1H), 7.48-7.53 (m, 3H), 7.63 (d, J=8.2 Hz, 1H), 7.75-7.79 (m, 1H), 7.80-7.86 (m, 2H), 8.86 (d, J=1.9 Hz, 1H). HRMS (Positive ESI) calcd. for C$_{66}$H$_{69}$AuN$_2$S: m/z=1118.4842; found: 1118.4819 [M]$^+$.

Example 2

UV-Vis Absorption Properties

The electronic absorption spectra of the tetradentate gold (III) compounds 2-13 in dichloromethane solution at 298 K showed intense absorption bands at ca. 300-400 nm with extinction coefficients in the order of 10$^4$ dm$^{-3}$ mol$^{-1}$ cm$^{-1}$, and a moderately intense absorption band at ca. 420-500 nm, as listed in,

| Compounds | Absorption λmax/nm (εmax/dm$^{-3mol-1cm-1}$) | Medium (T/K) | Emission λmax/nm | Φluma |
|---|---|---|---|---|
| 2 | 294 (85420), 340 sh (34095), 413 (5280), 435 (5105) | CH2C12 (298) MCP (298) | 509, 538 505, 535 | 0.32 0.66 |
| 3 | 270 (56150), 415 (5490), 438 (4810) | CH2C12 (298) | 546, 583 | 6.6 × 10$^{-3}$ |
| 4 | 284 (57050), 319 (35070), 425(5060), 448 (4170) | CH2C12 (298) | 542 | 0.02 |
| 5 | 269 (50490), 312 (57025), 414 (5200), 436 (4450) | CH2C12 (298) | 543, 580 | 5.7 × 10$^{-3}$ |
| 6 | 273 (53020), 320 (35145), 432 (28465) | CH2C12 (298) MCP (298) | 572 526 | 0.60 0.22 |
| 7 | 282 (56860), 330 (33860), 351 sh (26285), 425 (9775) | CH2C12 (298) MCP (298) | 620 585, 626 sh | 6.0 × 10$^{-3}$ 0.127 |
| 8 | 287 (59610), 368 (26635), 485 (7575) | CH2C12 (298) MCP (298) | 586 560 | 0.44 0.74 |

-continued

| Compounds | Absorption λmax/nm (εmax/dm$^{-3}$mol$^{-1}$cm$^{-1}$) | Medium (T/K) | Emission λmax/nm | Φlum$^a$ |
|---|---|---|---|---|
| 9 | 290 (45525), 313 sh (39360), | CH2Cl2 (298) | 584 | 0.41 |
|   | 371 (20395), 485 (7125) | MCP (298) | 578 | 0.74 |
| 10 | 279 (44740), 316 (42680), | CH2Cl2 (298) | 605 | 0.49 |
|   | 380 (25850), 500 (7245) | MCP (298) | 572 | 0.80 |
| 11 | 279 (47885), 317 (49770), | CH2Cl2 (298) | 615 | 0.43 |
|   | 383 (25540), 500 (8300) | MCP (298) | 581 | 0.76 |
| 12 | 295 (59670), 390 (7585), | CH2Cl2 (298) | 651 | 0.03 |
|   | 412 (7210), 488 (6120) | MCP (298) | 596 | 0.34 |
| 13 | 296 (47930), 392 (6520), | CH2Cl2 (298) | 651 | 0.04 |
|   | 412 (6865), 480 (4925) | MCP (298) | 597 | 0.33 | below, and FIGS. 2-5. Compounds 2-5 showed a vibronic-structured low-energy absorption band with vibrational progressional spacings of 1,250 cm$^{-1}$, corresponding to the skeletal vibrational frequencies of the diarylpyridine ligand. The origin of this absorption band is tentatively assigned as the intraligand (IL) [π→π*] transition of the diarylpyridine ligand. Compounds 6-11 showed a broad structureless low-energy absorption band, and the origin is tentatively assigned as intraligand charge transfer (ILCT) transition. For compound 6, due to the presence of the electron-donating triphenylamine group at the 4-position of pyridine, the transition is tentatively assigned as ILCT [π(triphenylamine)→π*(diarylpyridine)] transition. For compound 7, since the electron-donating thieno[3,2-b]indole unit is introduced into the alkynyl framework, the presence of a low-lying [π(alkynyl-thieno[3,2-b]indole)→π*(diarylpyridine)] ILCT transition is possible. For compounds 8-11, in view of the presence of the electron-donating amine group attached to the diarylpyridine core, the transition is possibly originated from an ILCT [π(phenylamine)→π*(diarylpyridine)] transition. Compounds 12 and 13 showed the structureless lower-energy absorption band at 482 nm and 490 nm, respectively, which was tentatively assigned as the ILCT [π(diarylamine)→π*(diarylpyridine)] transition.

Example 3

Photoluminescence Properties

Figure 6:
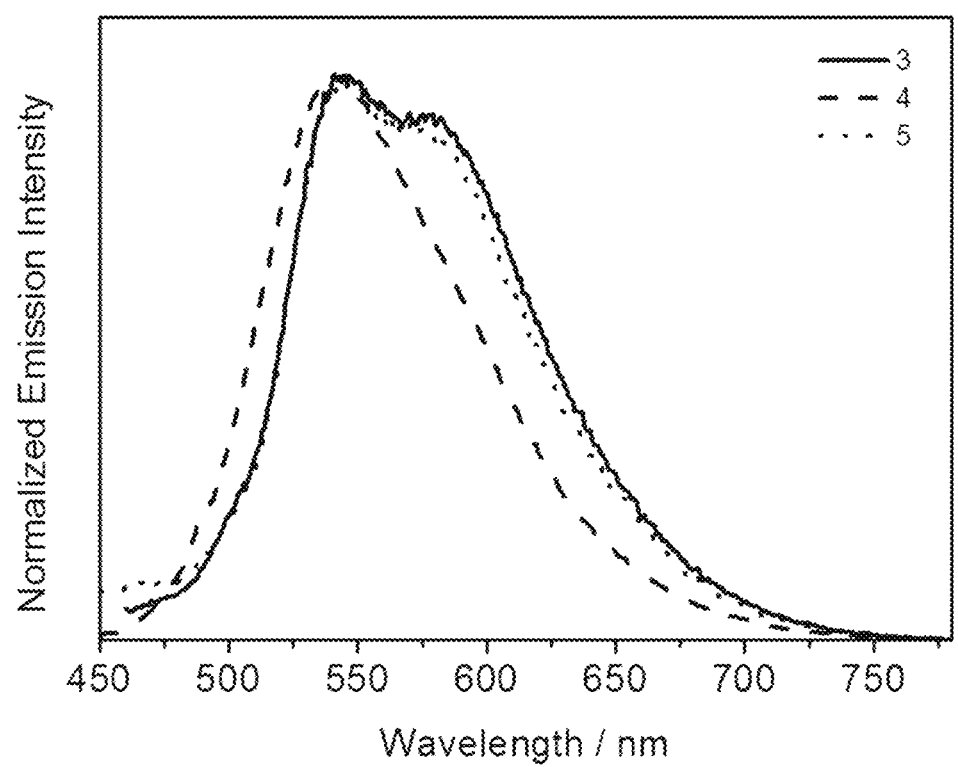
FIG. 6 shows the normalized photoluminescence spectra of compounds 3-5 in dichloromethane at 298 K, in accordance with an embodiment of the present invention.
Figure 7:
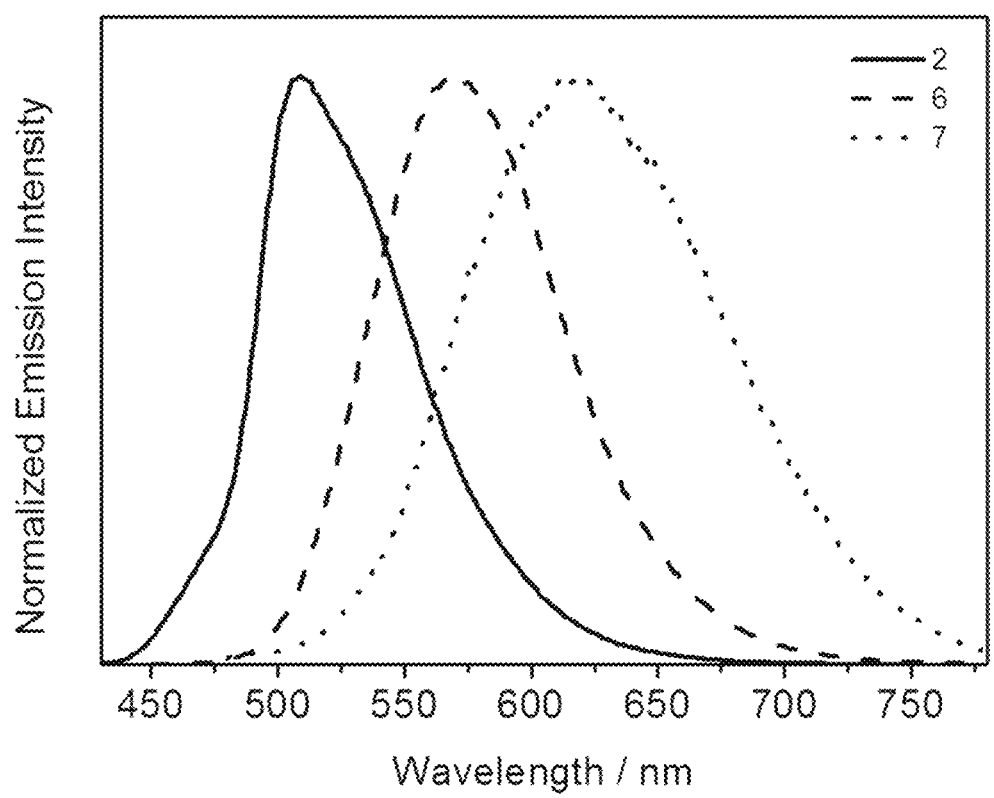
FIG. 7 shows the normalized photoluminescence spectra of compounds 2, 6 and 7 in dichloromethane at 298 K, in accordance with an embodiment of the present invention.
Figure 8:
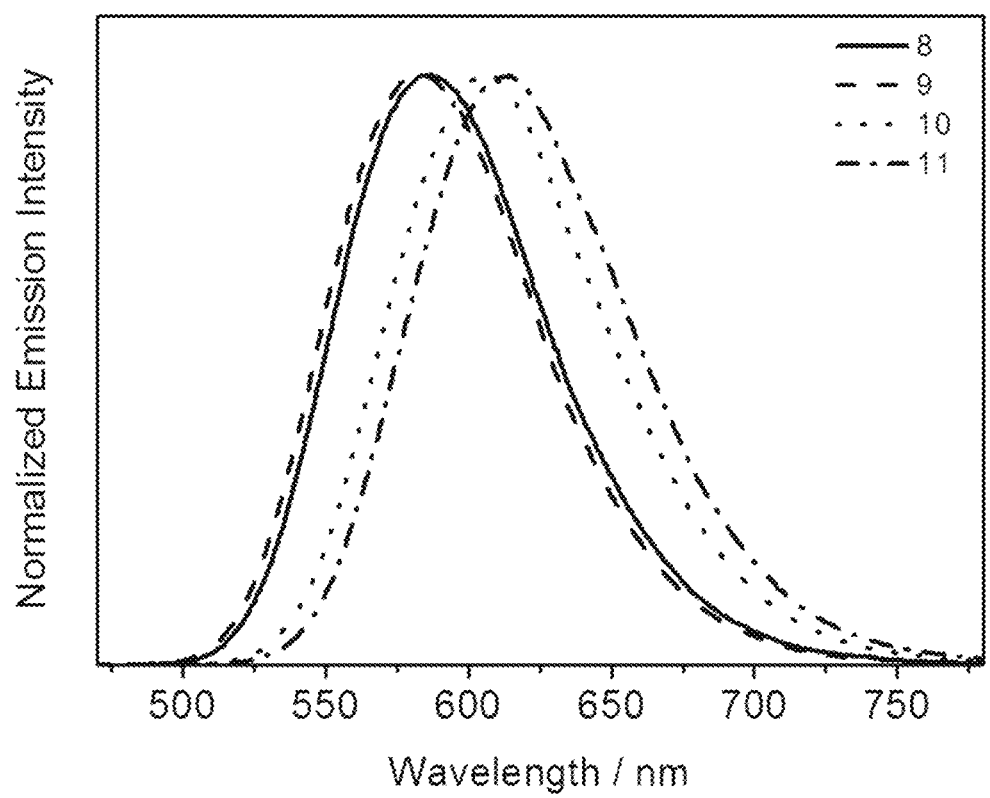
FIG. 8 shows the normalized photoluminescence spectra of compounds 8-11 in dichloromethane at 298 K, in accordance with an embodiment of the present invention.
Figure 9:
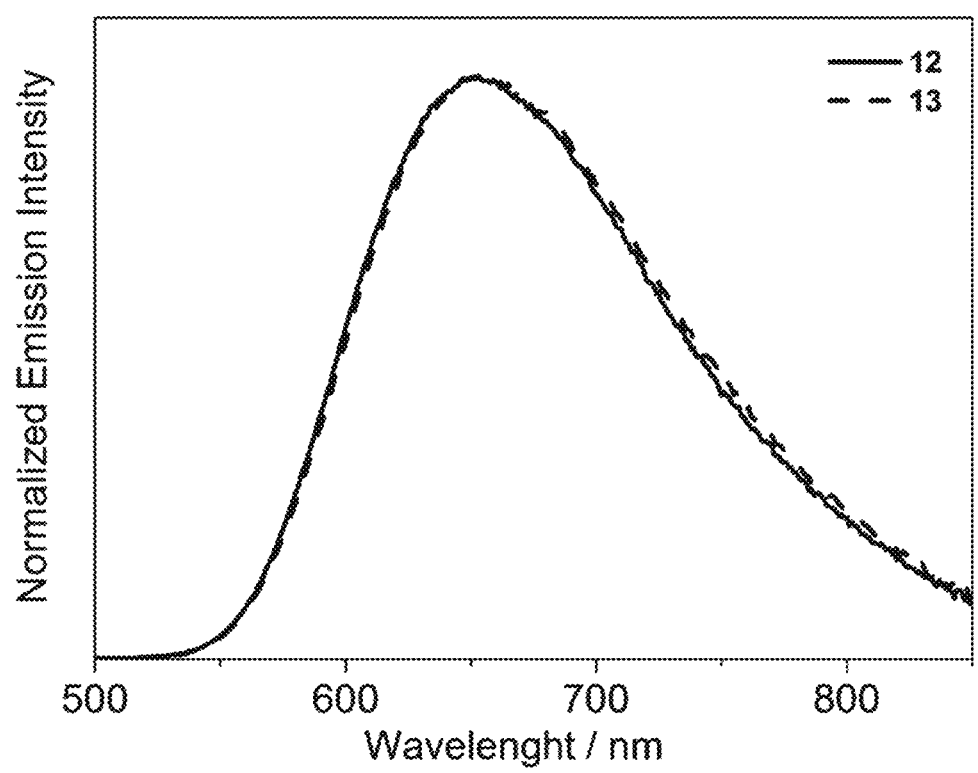
FIG. 9 shows the normalized photoluminescence spectra of compounds 12 and 13 in dichloromethane at 298 K, in accordance with an embodiment of the present invention.

Tetradentate gold(III) compounds of the present invention exhibit rich luminescence at both room temperature and low temperature in various media. Upon photo-excitation in dichloromethane solution at room temperature, compounds 2-13 showed intense luminescence at 509-653 nm as shown in FIGS. 6-9. A vibronic-structured emission band with band maximum at ca. 545 nm was observed for compounds 3-5 as shown in FIG. 6, whereas compound 2 showed a structured emission band at ca. 509 nm. Vibrational progressional spacings of ca. 1,100 cm$^{-1}$ were observed in these three compounds. These vibronic-structured emission bands are tentatively assigned as derived from metal-perturbed $^3$IL [π→π*] state of the diarylpyridine framework. Upon introducing electron-donating group, compounds 4-11 showed a structureless emission at ca. 542-620 nm, which is tentatively assigned as derived from an excited state of metal-perturbed ILCT origin from the electron-rich arylamino functional group to the diarylpyridine. Besides, compounds 12 and 13 exhibited a structureless emission band at ca. 655 nm, derived from the $^3$ILCT [π(diarylamine)→π*(diarylpyridine)] excited state.

TABLE 1

| Compounds | Absorption λ$_{max}$/nm (ε$_{max}$/dm$^{-3}$mol$^{-1}$cm$^{-1}$) | Medium (T/K) | Emission λ$_{max}$/nm | Φ$_{lum}$$^a$ |
|---|---|---|---|---|
| 2 | 294 (85420), 340 sh (34095), | CH$_2$Cl$_2$ (298) | 509, 538 | 0.32 |
|   | 413 (5280), 435 (5105) | MCP (298) | 505, 535 | 0.66 |
| 3 | 270 (56150), 415 (5490), | CH$_2$Cl$_2$ (298) | 546, 583 | 6.6 × 10$^{-3}$ |
|   | 438 (4810) | | | |
| 4 | 284 (57050), 319 (35070), | CH$_2$Cl$_2$ (298) | 542 | 0.02 |
|   | 425 (5060), 448 (4170) | | | |
| 5 | 269 (50490), 312 (57025), | CH$_2$Cl$_2$ (298) | 543, 580 | 5.7 × 10$^{-3}$ |
|   | 414 (5200), 436 (4450) | | | |
| 6 | 273 (53020), 320 (35145), | CH$_2$Cl$_2$ (298) | 572 | 0.60 |
|   | 432 (28465) | MCP (298) | 526 | 0.22 |
| 7 | 282 (56860), 330 (33860), | CH$_2$Cl$_2$ (298) | 620 | 6.0 × 10$^{-3}$ |
|   | 351 sh (26285), 425 (9775) | MCP (298) | 585, 626 sh | 0.127 |
| 8 | 287 (59610), 368 (26635), | CH$_2$Cl$_2$ (298) | 586 | 0.44 |
|   | 485 (7575) | MCP (298) | 560 | 0.74 |
| 9 | 290 (45525), 313 sh (39360), | CH$_2$Cl$_2$ (298) | 584 | 0.41 |
|   | 371 (20395), 485 (7125) | MCP (298) | 578 | 0.74 |
| 10 | 279 (44740), 316 (42680), | CH$_2$Cl$_2$ (298) | 605 | 0.49 |
|   | 380 (25850), 500 (7245) | MCP (298) | 572 | 0.80 |
| 11 | 279 (47885), 317 (49770), | CH$_2$Cl$_2$ (298) | 615 | 0.43 |
|   | 383 (25540), 500 (8300) | MCP (298) | 581 | 0.76 |
| 12 | 295 (59670), 390 (7585), | CH$_2$Cl$_2$ (298) | 651 | 0.03 |
|   | 412 (7210), 488 (6120) | MCP (298) | 596 | 0.34 |

TABLE 1-continued

| Compounds | Absorption $\lambda_{max}$/nm ($\varepsilon_{max}$/dm$^{-3}$mol$^{-1}$cm$^{-1}$) | Medium (T/K) | Emission $\lambda_{max}$/nm | $\Phi_{lum}{}^a$ |
|---|---|---|---|---|
| 13 | 296 (47930), 392 (6520), 412 (6865), 480 (4925) | CH$_2$Cl$_2$ (298) MCP (298) | 651 597 | 0.04 0.33 |

$^a$Relative luminescence photoluminescence quantum yield, measured at room temperature using [Ru(bpy)$_3$]Cl$_2$ in aqueous state as the reference. The absolute photoluminescence quantum yield of thin films was measured on a Hammamatsu C9920-03 Absolute Photoluminescence Quantum Yield Measurement System.

Figure 10:
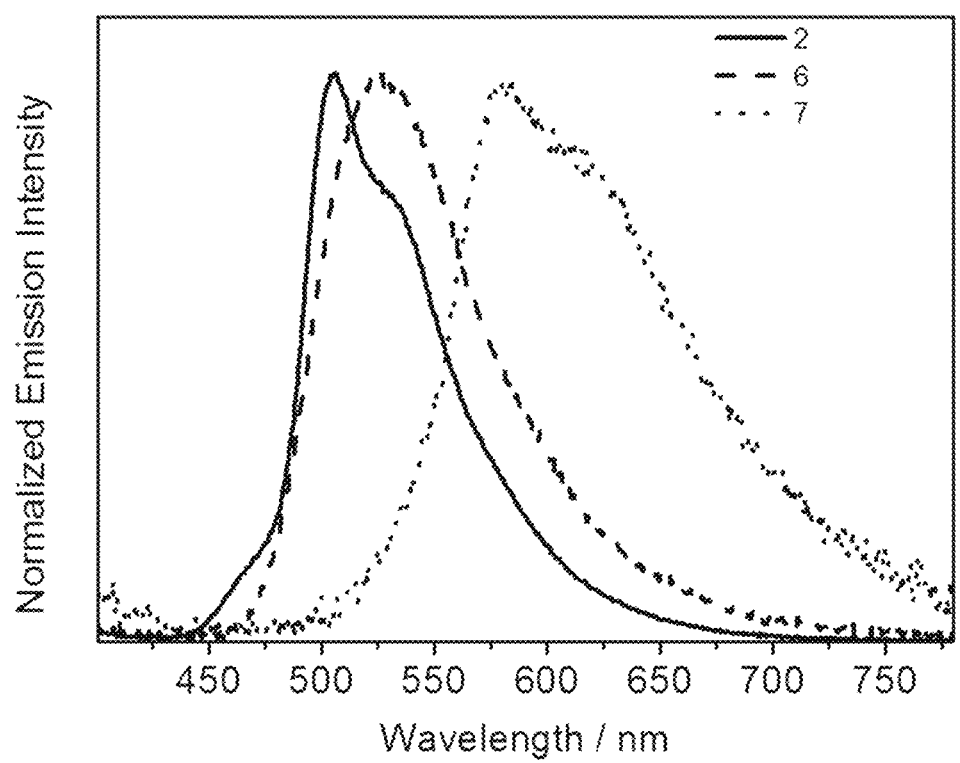
FIG. 10 shows the normalized photoluminescence spectra of 5 wt % compounds 2, 6 and 7 doped into N,N'-dicarbazolyl-3,5-benzene (MCP) thin film, in accordance with an embodiment of the present invention.
Figure 11:
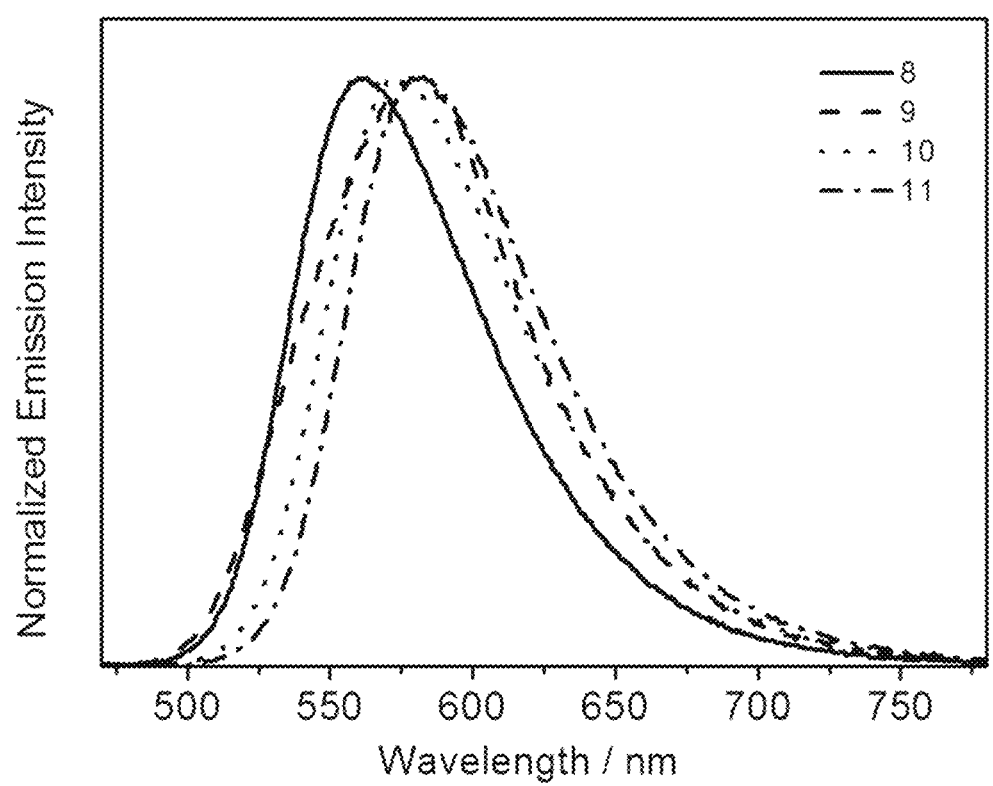
FIG. 11 shows the normalized photoluminescence spectra of 5 wt % compounds 8-11 doped into MCP thin films, in accordance with an embodiment of the present invention.

FIG. 10 shows the normalized emission spectra of compounds 2, 6 and 7 doped in MCP thin films. For compound 2, both the emission of the thin film and solution displayed vibronic-structured emission bands, and the emission spectrum in the thin film state showed a hypsochromic shift of 155 cm$^{-1}$ compared to the emission spectrum in dichloromethane solution. The vibronic emission of compound 2 is tentatively assigned as derived from metal-perturbed IL$^3$ [$\pi\rightarrow\pi$*] state of the diarylpyridine framework. A structureless emission band was observed for compound 6 doped into MCP film. The origin of this emission band is tentatively assigned as ILCT state derived from [$\pi$(triphenylamine)$\rightarrow\pi$*(diarylpyridine)] transition. Furthermore, compounds 8-11 exhibit structureless emission bands at ca. 560-581 nm as shown in FIG. 11. These emission bands are tentatively assigned as originating from ILCT [$\pi$(phenylamine)$\rightarrow\pi$*(diarylpyridine)] state.

Example 4

Figure 12:
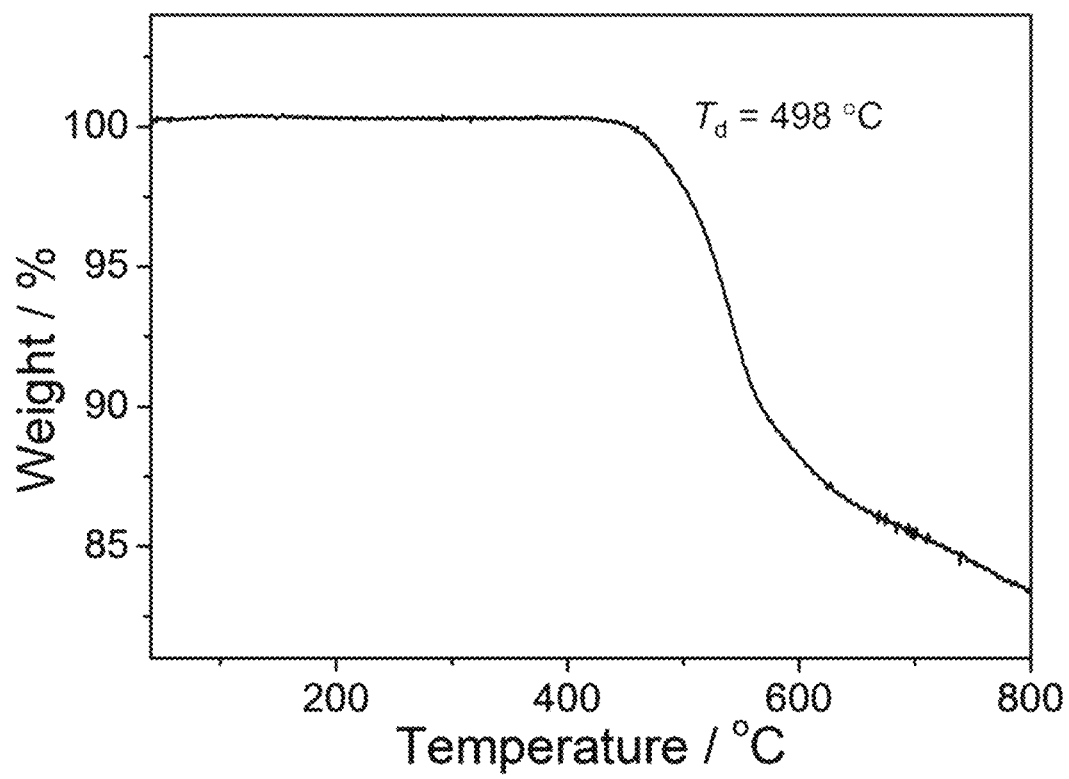
FIG. 12 shows the thermogravimetric analysis (TGA) analysis of compound 9, in accordance with an embodiment of the present invention.
Figure 13:
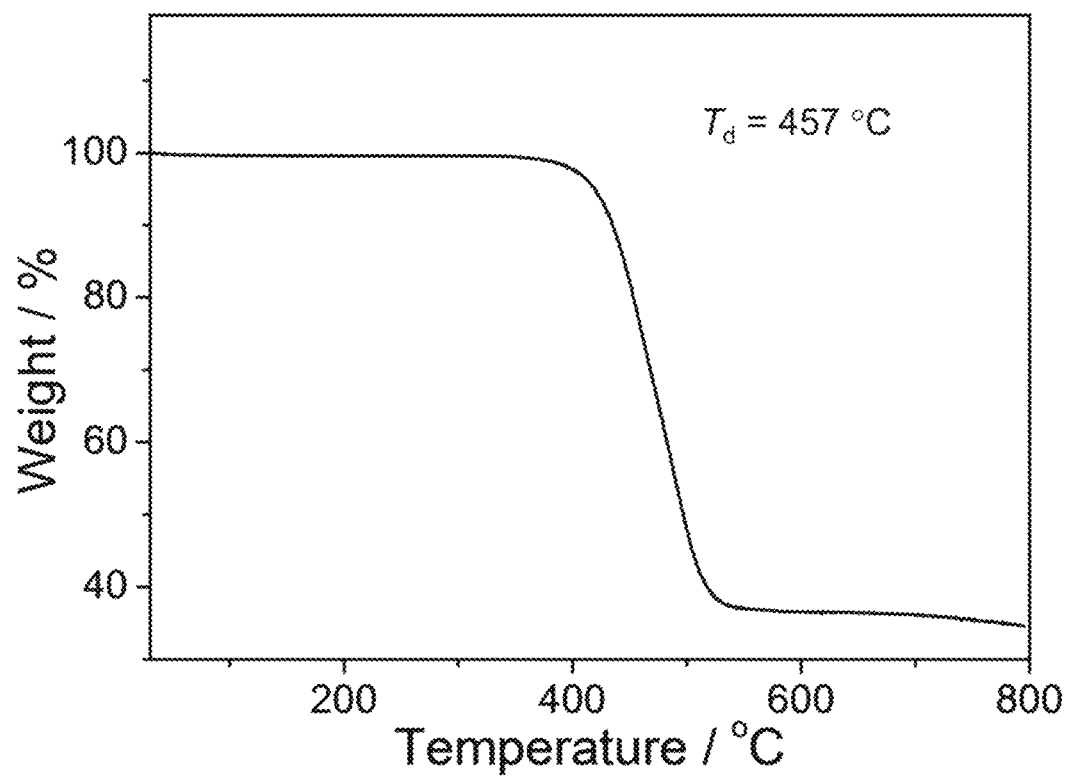
FIG. 13 shows the TGA analysis of compound 13, in accordance with an embodiment of the present invention.

The decomposition temperature of the tetradentate gold (III) compound had been measured by thermogravitic analysis (TGA). All the compounds are thermally stable and exhibit high decomposition temperature, which is defined as the temperature at which the material shows a 5% weight loss. FIGS. 12 and 13 show the TGA curves of the selected compounds 9 and 13, respectively. Notably, high decomposition temperatures of 498° C. and 457° C. were found for compounds 9 and 13, respectively.

Example 5

An organic EL device according to an embodiment of the invention was constructed in the following manner:
(a) A transparent anode ITO-coated borosilicate glass substrate (38 mm×38 mm) with sheet resistance of 30Ω square$^{-1}$ was ultra-sonicated in the commercial detergent Decon 90, rinsed in deionized water having a resistivity of 18.2 MΩ for 15 minutes, and then dried in an oven at 120° C. for an hour. The substrate was next subjected to an UV-ozone treatment in a Jelight 42-220 UVO-Cleaner equipped with a mercury grid lamp for 15 minutes in order to increase the work function of the ITO-coated glass substrate for better hole injection into the organic layer.
(b) A 40-thick PEDOT:PSS hole-transporting layer was spin-coated by using a Laurell WS-400Ez6NPP-Lit2 single wafer spin processor at 7000 rpm for 30 seconds onto the ITO-coated glass substrate of step (a) and baked at 110 degree C. for 10 minutes in air.
(c) A 30-nm thick light-emitting layer was spin coated by using a Laurell WS-400Ez-6NPP-Lit2 single wafer spin processor at 6000 rpm for 25 seconds onto PEDOT:PSS layer of step (b), and baked at 80 degree C. for 10 minutes in air, in which compound 10 was doped into light-emitting MCP layer at different concentrations in the range from 5 to 20%;
(d) The substrate was put into a vacuum chamber, and the chamber was pumped down from 1 bar to 5×10$^{-6}$ mbar;
(e) A 5-nm thick 3TPyMB carrier confinement layer and a 30-nm thick TmPyPB electron-transporting layer were deposited by thermal evaporation on doped CBP light-emitting layer.
(f) A 0.8-nm thick LiF layer and an 80 nm thick Al layer were deposited by thermal evaporation on the TmPyPB layer to form an electron-injecting cathode.

Figure 14:
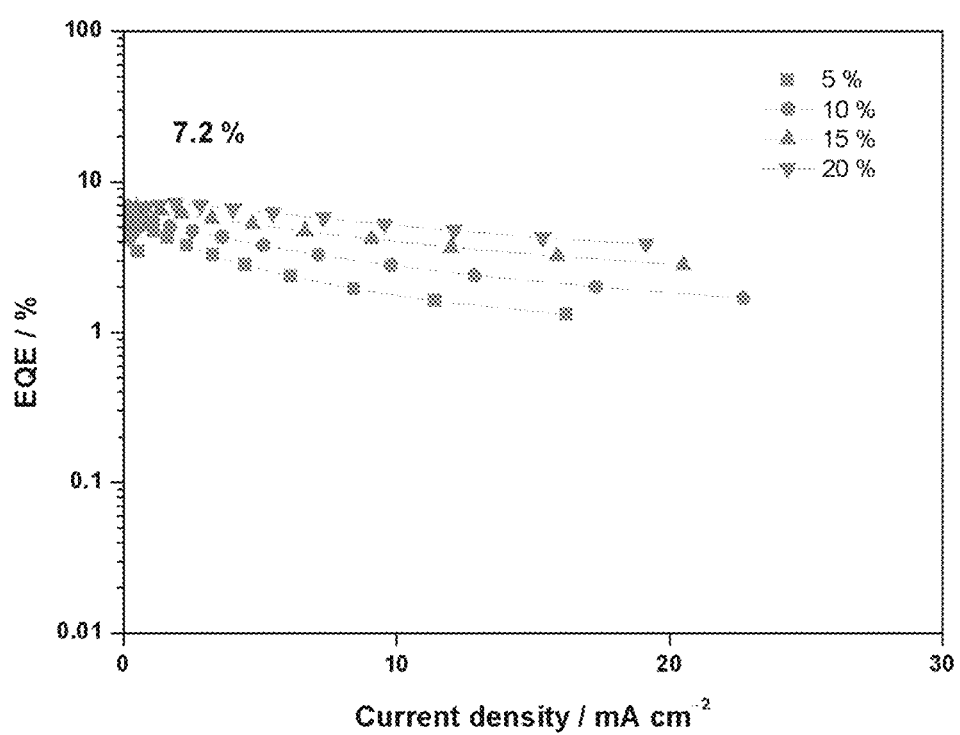
FIG. 14 shows the EQE of the device with compound 10 doped into MCP as light-emitting layer, in accordance with an embodiment of the present invention.

3TPyMB, TmPyPB, LiF and Al were prepared by thermal evaporation from tantalum boats by applying current through the tantalum boats. Deposition rates were monitored with a quartz oscillation crystal and a Sigma SQM-242 quartz crystal card and controlled at 0.1-0.2 nm s$^{-1}$ for both organic and metal layers. Current density-voltage-luminance characteristics of organic electroluminescence devices were measured with a programmable Keithley model 2420 power source and a Spectrascan PR-655 colorimeter under ambient air conditions. OLEDs doped with 20% compound 10 showed a saturated yellow color with the Commission Internationale de L'Eclairage coordinates of (0.54, 0.46) and a maximum EQE of 7.2% as shown in FIG. 14.

Example 6

Figure 15:
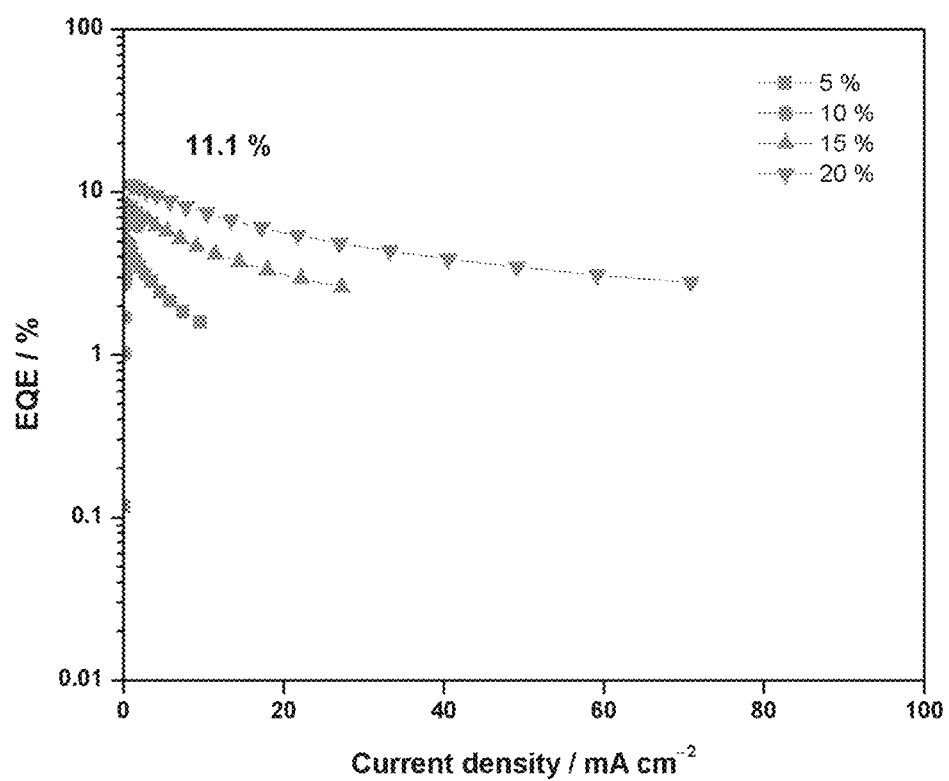
FIG. 15 shows the EQE of the device with compound 11 doped into MCP as light-emitting layer and the electroluminescence spectra of device compound 10 as light-emitting layer, in accordance with an embodiment of the present invention.

The same materials and processing procedures were employed as described in Example 4 except that compound 11 was doped into MCP as light emissive layer. Device doped with 20% of compound 11 shows a structureless orange emission with peak maximum at 590 nm and a high EQE of 11.1%, as shown in FIG. 15. In some embodiments of the invention, these tetradentate gold(III) compounds possess desirable electrophosphorescent properties, and are candidates as electrophosphorescent dopants for OLEDs.

With respect to any FIG. or numerical range for a given characteristic, a FIG. or a parameter from one range may be combined with another FIG. or a parameter from a different range for the same characteristic to generate a numerical range.

Other than in the operating examples, or where otherwise indicated, all numbers, values and/or expressions referring to quantities of ingredients, reaction conditions, etc., used in the specification and claims are to be understood as modified in all instances by the term "about".

It should be understood that the examples and embodiments described herein are for illustrative purposes only and that various modifications or changes in light thereof will be suggested to persons skilled in the art and are to be included within the spirit and purview of this application.

The invention claimed is:
1. A luminescent tetradentate gold(III) compound comprising the chemical structure represented by the following general Formula I,

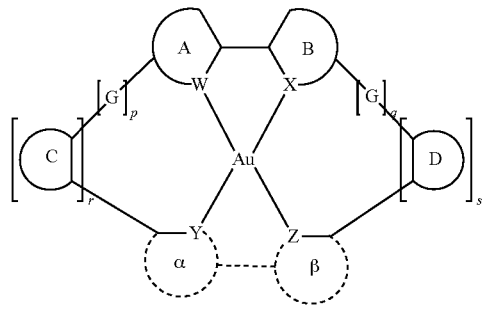

Formula I wherein:
(a) W is N, X and Y are independently C, O, N, or P, and Z is C(alkynyl), C(aryl), C—N≡C(isocyanide), or C—C≡N(cyanide), wherein A-B and Au form a 5-membered ring chelate, and wherein B-D-β or A-C-α and Au independently form at least one 6-13-membered ring chelate by an intramolecular cyclization reaction;
(b) A, B, C and D are independently a cyclic structure selected from substituted or unsubstituted phenyl group, substituted or unsubstituted heteroaryl group, or substituted or unsubstituted polycyclic group thereof;
(c) α and β are independently a cyclic structure, acyclic structure, or any derivative thereof, wherein the cyclic structure is selected from a substituted or unsubstituted phenyl group, substituted or unsubstituted heteroaryl group, substituted or unsubstituted cycloalkyl group, and substituted or unsubstituted polycyclic group, and wherein the acyclic structure is selected from substituted or unsubstituted alkynyl, substituted or unsubstituted arylalkynyl, substituted or unsubstituted alkyl, substituted or unsubstituted alkylaryl, substituted or unsubstituted alkoxy, and substituted or unsubstituted arylalkoxy;
(d) $[G]_p$ is a non-coordination site, and is C=O, NR, O, PR, P(=O)R, BR, S, SO, $SO_2$, SiRR', Se, AsR,

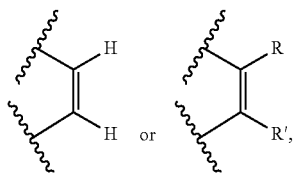

when S=0 $[G]_q$ is a non-coordination site, and is C=O, PR, P(=O)R, BR, SO, $SO_2$, Se, AsR,

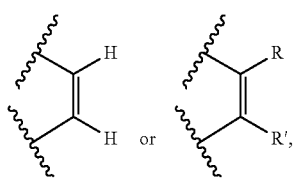

and when S>0 $[G]_q$ is a non-coordination site, and is C=O, NR, O, PR, P(=O)R, BR, S, SO, $SO_2$, SiRR', Se, AsR,

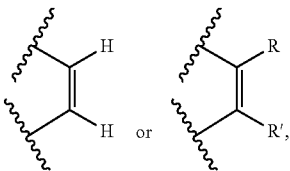

wherein R and R' are independent selected from hydrogen, halogen, aryl, alkyl, heteroaryl, nitro, trifluoromethyl, cyano, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfonyl, sulfhydryl, halo, aryl, substituted aryl, heteroaryl, substituted heteroaryl, heterocyclyl, and derivatives thereof; and
(e) p, q, r and s are each independently 0-3, and wherein the dashed lines in Formula I represent that each of α and β can independently be cyclic or acyclic.

2. The tetradentate gold(III) compound according to claim 1, wherein A, B, C, D, optionally α and optionally β, are independently selected from benzene, pyridine, thiophene, furan, pyrazole, oxadiazole, thiadiazole, imidazole, oxazole, isoxazole, thiazole, isothiazole, isoquinoline, pyrrole, pyrazine, pyridazine, pyrimidine, benzimidazole, benzofuran, benzothiazole, indole, indolocarbazole, benzopyrrolizinophenoxazine, naphthalene, anthracene, pyrene, triazole, tetrazole, pyran, thiapyran, oxadiazole, triazine, tetrazine, carbazole, dibenzothiophene, dibenzofuran, fluorine, and derivatives thereof.

3. The tetradentate gold(III) compound according to claim 1, wherein one or more of A, B, C, D, optionally α and optionally β, are substituted with one or more of alkyl, alkenyl, alkynyl, alkylaryl, cycloalkyl, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, NRR', SR, C(O)R, COOR, C(O)$NR_2$, SOR, $SO_3R$, BRR' or derivatives thereof; and R and R' are independently selected from hydrogen, deuterium, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, and derivatives thereof.

4. The tetradentate gold(III) compound according to claim 1, wherein independently any two adjacent substituted positions of at least two of A, B, C, D, optionally α and optionally β, form a fused 5- to 6-membered cyclic group selected from cycloalkyl, cycloheteroalkyl, aryl, and heteroaryl, wherein the fused 5- to 6-membered cyclic group is unsubstituted or substituted with one or more of alkyl, alkenyl, alkynyl, alkylaryl, cycloalkyl, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, NRR', SR, C(O)R, COOR, C(O)NR$_2$, SOR, SO$_3$R, BRR' or derivatives thereof; wherein R and R' are independently selected from hydrogen, deuterium, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, and derivatives thereof.

5. The tetradentate gold(III) compound according to claim 1, wherein the gold(III) compounds are selected from:

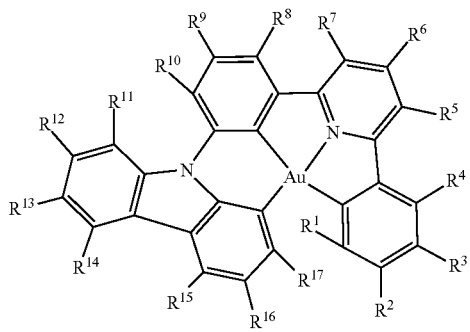

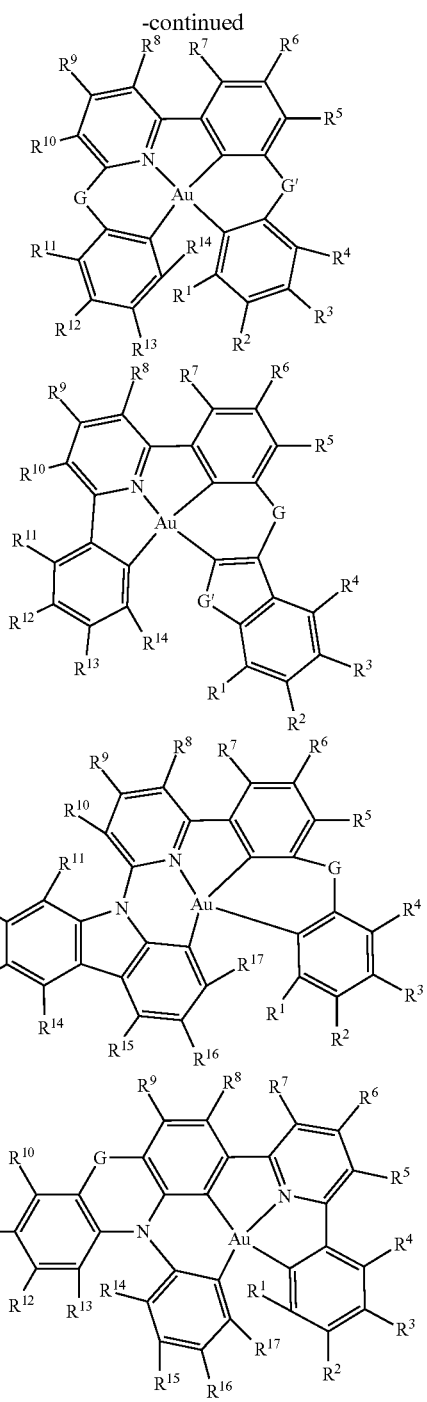

wherein, G, G', G" and G'" are independently selected from C=O, NR, O, BR, S, SO, SO$_2$, SiRR', Se and AsR, wherein R and R' are independently selected from hydrogen, deuterium, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, and derivatives thereof; and, $R^1$ to $R^{23}$ are each independently selected from hydrogen, deuterium, alkyl, alkenyl, alkynyl, alkylaryl, cycloalkyl, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, aryl ether, alkyl ether, heteroaryl ether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, NRR', SR, C(O)R, COOR, C(O)NR$_2$, SOR, SO$_3$R, BRR', and derivatives thereof, wherein R and R' are independently selected from hydrogen, deuterium, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

6. The tetradentate gold(III) compound according to claim 1, wherein the gold(III) compounds are selected from:

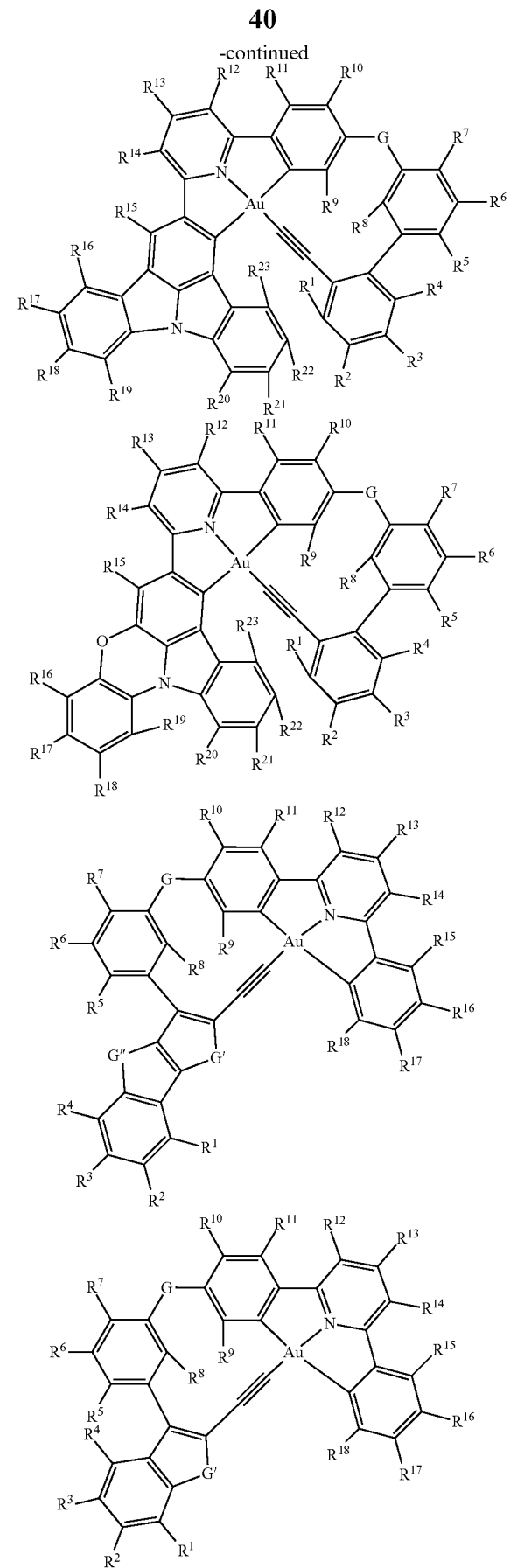

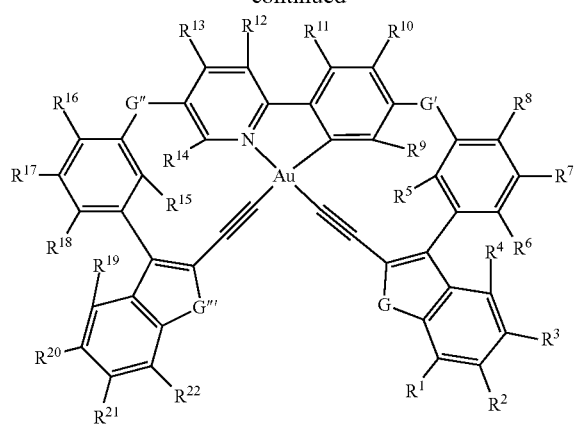
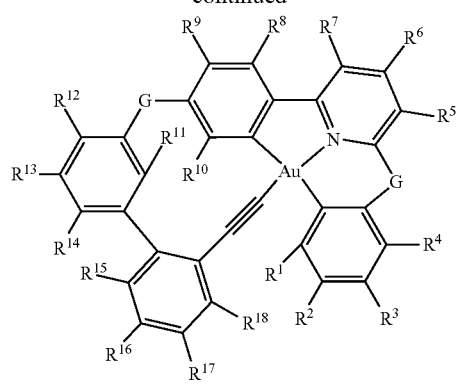
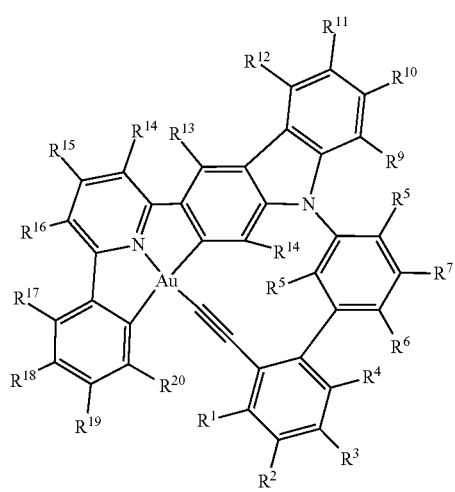
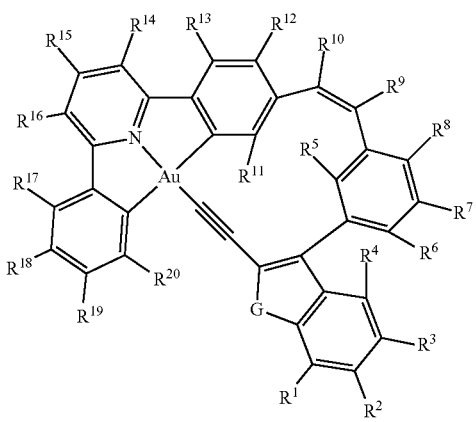
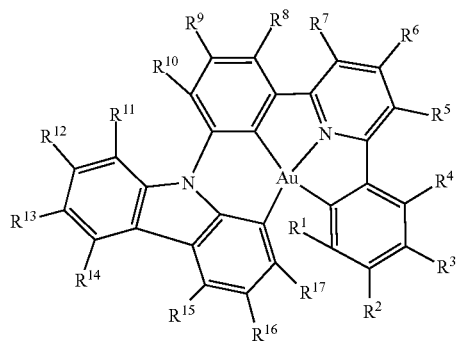
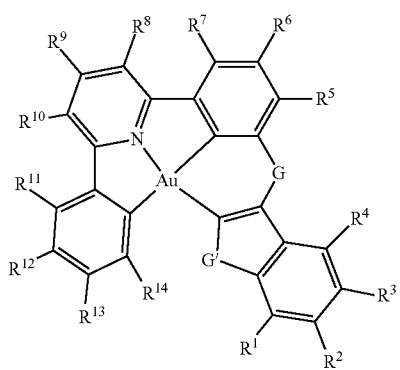
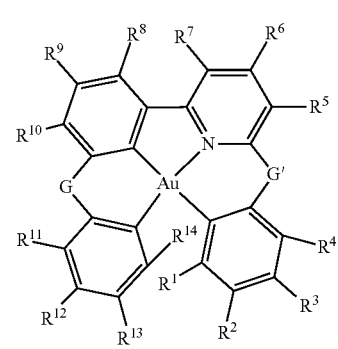
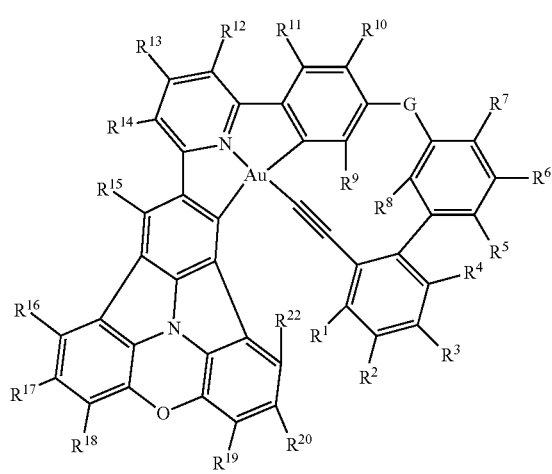

-continued

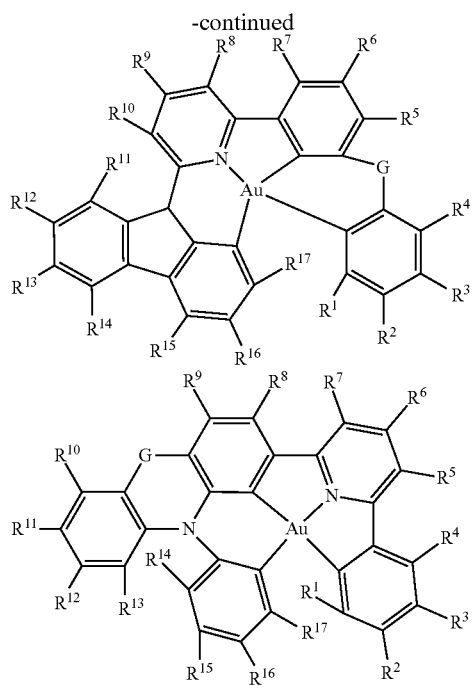

wherein, G, G', G" and G'" are independently selected from C=O, NR, O, BR, S, SO, SO$_2$, SiRR', Se and AsR, wherein R and R' are independently selected from hydrogen, deuterium, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, aryl ether, alkyl ether, heteroaryl ether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, and derivatives thereof; and, $R^1$ to $R^{23}$ are each independently selected from hydrogen, deuterium, alkyl, alkenyl, alkynyl, alkylaryl, cycloalkyl, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, aryl ether, alkyl ether, heteroaryl ether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic, NRR', SR, C(O)R, COOR, C(O)NR$_2$, SOR, SO$_3$R, BRR', and derivatives thereof, wherein R and R' are independently selected from hydrogen, deuterium, formaldehyde, cyano, alkylalkynyl, substituted alkylalkynyl, arylalkynyl, substituted arylalkynyl, heteroarylalkynyl, substituted heteroarylalkynyl, condensed polycyclic, substituted condensed polycyclic, aryl, alkyl, heteroaryl, nitro, trifluoromethane, cyano, aryl ether, alkyl ether, heteroaryl ether, diarylamine, dialkylamine, diheteroarylamine, diarylborane, triarylsilane, trialkylsilane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclic and derivatives thereof.

7. The tetradentate gold(III) compound of claim 1, wherein at least one substituent of A, B, C, D, optionally α and optionally β, is further derived to form a bridging substituent wherein two or more of the tetradentate gold(III) compounds are combined as a dimer, trimer, oligomer, or polymer.

8. A method for the preparation of a luminescent tetradentate gold(III) compound, the luminescent tetradentate gold (III) compound comprising the chemical structure represented by the following general Formula I:

Formula I

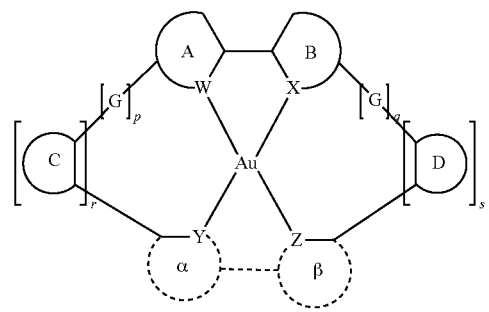

wherein:
(a) W, X, Y and Z are independently selected from C, O, N, P, C—C≡C(alkynyl), C(aryl), C—N≡C(isocyanide) or C—C≡N(cyanide) and wherein W-A-B-X and Au form a 5-membered ring chelate;
(b) A, B, C and D are independently a cyclic structure selected from substituted or unsubstituted phenyl group, substituted or unsubstituted heteroaryl group, or substituted or unsubstituted polycyclic group thereof;
(c) α and β are independently a cyclic structure, acyclic structure, or any derivative thereof, wherein the cyclic structure is selected from a substituted or unsubstituted phenyl group, substituted or unsubstituted heteroaryl group, substituted or unsubstituted cycloalkyl group, and substituted or unsubstituted polycyclic group, and wherein the acyclic structure is selected from substituted or unsubstituted alkynyl, substituted or unsubstituted arylalkynyl, substituted or unsubstituted alkyl, substituted or unsubstituted alkylaryl, substituted or unsubstituted alkoxy, and substituted or unsubstituted arylalkoxy;
(d) $[G]_p$ is a non-coordination site, and is CRR', C=O, NR, O, PR, P(=O)R, BR, S, SO, SO$_2$, SiRR', Se, AsR,

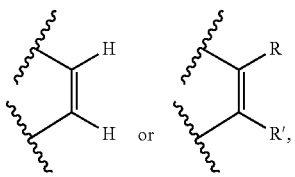

when S=0 $[G]_q$ is a non-coordination site, and is C=O, PR, P(=O)R, BR, SO, SO$_2$, Se, AsR,

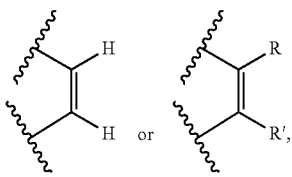

and when S>0 [G]$_q$ is a non-coordination site, and is CRR', C=O, NR, O, PR, P(=O)R, BR, S, SO, SO$_2$, SiRR', Se, AsR,

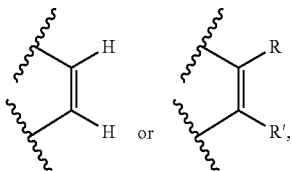

wherein R and R' are independent selected from hydrogen, halogen, aryl, alkyl, heteroaryl, nitro, trifluoromethyl, cyano, aryl ether, alkyl ether, heteroaryl ether, diarylamine, dialkylamine, diheteroarylamine, diarylborane, triarylsilane, trialkylsiliane, alkenyl, alkylaryl, cycloalkyl, haloformyl, hydroxyl, aldehyde, carboxamide, amine, amino, alkoxy, azo, benzyl, carbonate ester, carboxylate, carboxyl, ketamine, isocyanate, isocyanide, isothiocyanate, nitrile, nitro, nitroso, phosphine, phosphate, phosphono, pyridyl, sulfonyl, sulfo, sulfinyl, sulfhydryl, halo, aryl, substituted aryl, heteroaryl, substituted heteroaryl, heterocyclyl, and derivatives thereof; and (e) p, q, r and s are each independently 0-3,
wherein the method comprises:
providing a gold(III) precursor compound comprising a combination of monodentate, bidentate or tridentate ligand; and
intramolecularly cyclizing the gold(III) precursor compound to form the tetradentate gold(III) compound, and wherein the dashed lines in Formula I represent that each of α and β can independently be cyclic or acyclic.

9. The method of claim 8, further comprising adding at least one base, catalyst, or combination thereof to the gold(III) precursor compound.

10. The method of claim 9, wherein the base is selected from an organic base, an inorganic base, or a combination thereof.

11. The method of claim 9, wherein the catalyst is selected from a metal based catalyst, organic based catalyst, organometallic based catalyst, or any combination thereof.

12. The method according to claim 8, further comprising adding a solvent to the gold(III) precursor compound to form a solution.

13. The method according to claim 8, further comprising isolating the tetradentate gold(III) compound by chromatography, extraction, crystallization, sublimation, or any combination thereof.

14. The method according to claim 7, further comprising adding or substituting a substituent to the gold(III) precursor, the gold(III) precursor comprising a different tetradentate gold(III) compound.

15. A luminescent material, comprising a tetradentate gold(III) compound according to claim 1.

16. A light-emitting device, comprising at least one tetradentate gold(III) compound according to claim 1.

17. The light-emitting device according to claim 16, wherein the at least one gold(III) compound comprises a light-emitting layer.

18. The light-emitting device according to claim 17, wherein the gold(III) compound comprises a dopant in the light-emitting layer.

19. The light-emitting device according to claim 16, wherein the light-emitting layer is a spin-coated, inkjet printed, or vacuum deposited light-emitting layer.

20. The light-emitting device according to claim 15, wherein the light-emitting device is an organic light-emitting diode (OLED).

* * * * *